(12) United States Patent
Xia

(10) Patent No.: US 11,877,432 B2
(45) Date of Patent: Jan. 16, 2024

(54) CAPACITOR STRUCTURE AND METHOD OF PREPARING SAME

(71) Applicant: CHANGXIN MEMORY TECHNOLOGIES, INC., Hefei (CN)

(72) Inventor: Jun Xia, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 241 days.

(21) Appl. No.: 17/398,157

(22) Filed: Aug. 10, 2021

(65) Prior Publication Data

US 2021/0391335 A1    Dec. 16, 2021

Related U.S. Application Data

(63) Continuation of application No. PCT/CN2021/098706, filed on Jun. 7, 2021.

(30) Foreign Application Priority Data

Jun. 16, 2020   (CN) .......................... 202010547452.7

(51) Int. Cl.
| | |
|---|---|
| H10B 12/00 | (2023.01) |
| H01L 23/522 | (2006.01) |
| H01L 23/528 | (2006.01) |
| H01L 49/02 | (2006.01) |

(52) U.S. Cl.
CPC ............. *H10B 12/01* (2023.02); *H01L 28/91* (2013.01); *H01L 28/92* (2013.01)

(58) Field of Classification Search
CPC ......... H01L 28/87; H01L 28/91; H01L 28/92; H01L 23/5223; H10B 12/01; H10B 12/03
See application file for complete search history.

(56) References Cited

U.S. PATENT DOCUMENTS

| | | |
|---|---|---|
| 5,753,948 A | 5/1998 | Nguyen |
| 7,482,648 B2 | 1/2009 | Xianyu |
| 7,919,803 B2 | 4/2011 | Yokoi |
| (Continued) | | |

FOREIGN PATENT DOCUMENTS

| | | |
|---|---|---|
| CN | 1674284 A | 9/2005 |
| CN | 103390541 A | 11/2013 |
| (Continued) | | |

OTHER PUBLICATIONS

International Search Report in the international application No. PCT/CN2021/098706, dated Sep. 15, 2021, 2 pgs.

(Continued)

*Primary Examiner* — Omar F Mojaddedi
(74) *Attorney, Agent, or Firm* — Cooper Legal Group, LLC

(57) ABSTRACT

A capacitor structure and a method of preparing the same are provided. The method includes the followings. A substrate is provided. A stacked layer is formed on the substrate. A plurality of first via holes penetrating through the stacked layer are formed. The first via hole is filled with a conductive material to form a conductive pillar. A plurality of second via holes penetrating through the stacked layer are formed at a preset radius with the conductive pillar as an axis. The second via hole surrounds the conductive pillar circumferentially. The second via hole is filled with the conductive material to form an annular top electrode with a second gear.

20 Claims, 29 Drawing Sheets

(56) References Cited

U.S. PATENT DOCUMENTS

| | | |
|---|---|---|
| 8,993,396 B2 | 3/2015 | Park |
| 10,153,095 B2 | 12/2018 | Zhou |
| 10,490,361 B2 | 11/2019 | Zhou |
| 10,825,815 B2 | 11/2020 | Tang et al. |
| 2004/0002187 A1* | 1/2004 | Block ............... H01L 28/87 |
| | | 257/E27.048 |
| 2005/0139882 A1 | 6/2005 | Xianyu |
| 2009/0078981 A1* | 3/2009 | Yokoi ............... H01L 28/40 |
| | | 257/306 |
| 2012/0193761 A1 | 8/2012 | Park |
| 2013/0299942 A1 | 11/2013 | Park |
| 2015/0221718 A1 | 8/2015 | Rhie |
| 2015/0364611 A1* | 12/2015 | Funch ............... H01L 28/86 |
| | | 257/532 |
| 2017/0169958 A1* | 6/2017 | Zhou ............... H01G 11/80 |
| 2018/0323200 A1* | 11/2018 | Tang ............... H01L 23/528 |
| 2019/0074141 A1 | 3/2019 | Zhou |
| 2020/0411522 A1 | 12/2020 | Tang et al. |

FOREIGN PATENT DOCUMENTS

| | | |
|---|---|---|
| CN | 105206421 A | 12/2015 |
| CN | 106876152 A | 6/2017 |
| CN | 110459533 A | 11/2019 |
| CN | 110504284 A | 11/2019 |
| CN | 110574160 A | 12/2019 |
| CN | 110957303 A | 4/2020 |
| CN | 210296415 U | 4/2020 |
| JP | 2005117004 A | 4/2005 |

OTHER PUBLICATIONS

International Search Report in the international application No. PCT/CN2021/094216, dated Aug. 11, 2021, 2 pgs.

First Office Action of the Chinese application No. 202010550132.7, dated Apr. 28, 2022, 10 pgs.

\* cited by examiner

CAPACITOR STRUCTURE AND METHOD OF PREPARING SAME

CROSS-REFERENCE TO RELATED APPLICATIONS

The present application is a U.S. continuation application of International Application No. PCT/CN2021/098706, filed on Jun. 7, 2021, which claims priority to Chinese Patent Application No. 202010547452.7, filed on Jun. 16, 2020. International Application No. PCT/CN2021/098706 and Chinese Patent Application No. 202010547452.7 are incorporated herein by reference in their entireties.

TECHNICAL FIELD

The present disclosure relates to the technical field of an integrated circuit, and in particular to a capacitor structure and a method of preparing the same.

BACKGROUND

A Dynamic Random Access Memory (DRAM) is a common semiconductor storage device in a computer and is composed of many repeated storage units. In a preparation procedure of the DRAM below 20 nanometers (nm), most DRAMs use capacitor configuration with stacked layers. The capacitor thereof has a vertical cylinder shape with high depth-to-width ratio.

At present, a cylindrical double-sided capacitor is the main technology in the industry. FIG. 1A is a cross-sectional view of a cylindrical double-sided capacitor in a DRAM in the related art. FIG. 1B is a partial top view along a line A-A in FIG. 1A. Referring to FIG. 1A and FIG. 1B, a bottom electrode 10 is formed on the bottom and a sidewall of a cylindrical deep hole in an array region. The bottom electrode 10 is in contact with a bottom plate 14. A high-k dielectric material is deposited in the deep hole as an electrode dielectric layer 11. A top electrode 12 is formed on the electrode dielectric layer 11. The top electrode 12 is covered by a top plate 13.

With the development of the DRAM, the charge storage capability of the existing cylindrical double-sided capacitor cannot meet the requirements.

SUMMARY

An embodiment of the present disclosure provides a method of preparing a capacitor structure. The method includes the following operations. A substrate is provided, in which the substrate includes a conductive contact region and an insulating region which are spaced. A stacked layer is formed on the substrate, in which the stacked layer includes a plurality of units which are superimposed and a main dielectric layer located between adjacent two units, and each of the units includes a conductive layer, the main dielectric layer, and a sacrificial layer. A plurality of first via holes penetrating through the stacked layer are formed, in which the first via hole corresponds to the conductive contact region and exposes a part of an upper surface of the conductive contact region. A part of the sacrificial layer of a sidewall of the first via hole is removed to form a first groove in a corresponding region of the sacrificial layer of the sidewall of the first via hole. A first supplementary dielectric layer is formed in the first groove.

The first via hole is filled with a conductive material to form a conductive pillar, in which the conductive pillar is connected with the conductive layer, and the conductive pillar is connected with the conductive contact region. A plurality of second via holes penetrating through the stacked layer are formed at a preset radius with the conductive pillar as an axis, in which the second via hole surrounds the conductive pillar, the second via hole corresponds to the insulating region and exposes a part of an upper surface of the insulating region, and the conductive pillar and the conductive layer connected with the conductive pillar together form a columnar bottom electrode with a first gear. A part of the conductive layer of the sidewall of the second via hole is removed to form a second groove in a corresponding region of the conductive layer of the sidewall of the second via hole. A second supplementary dielectric layer is formed in the second groove, in which the main dielectric layer, the first supplementary dielectric layer, and the second supplementary dielectric layer cover the bottom electrode. All the sacrificial layer of the sidewall of the second via hole is removed. The second via hole is filled with the conductive material to form an annular top electrode with a second gear.

An embodiment of the present disclosure further provides a capacitor structure. The capacitor structure includes a columnar bottom electrode, an annular top electrode and a dielectric layer. The columnar bottom electrode includes a conductive pillar and a plurality of first gears. Each of the first gears is connected with an outer side surface of the conductive pillar and is perpendicular to a side surface of the conductive pillar. The plurality of first gears is sequentially arranged along an axial direction of the conductive pillar. The annular top electrode includes an annular main body and a plurality of second gears. The second gear penetrates through the annular main body along a direction perpendicular to the axial direction of the annular main body. The plurality of second gears are sequentially arranged along the axial direction of the annular main body. The annular main body surrounds the columnar bottom electrode. The first gear and the second gear are alternatively arranged. The dielectric layer is disposed between the columnar bottom electrode and the annular top electrode.

DETAILED DESCRIPTION

A capacitor structure and a method of preparing the same provided by an example of the present disclosure are described below in detail with reference to the accompanying drawings.

Figure 1A:
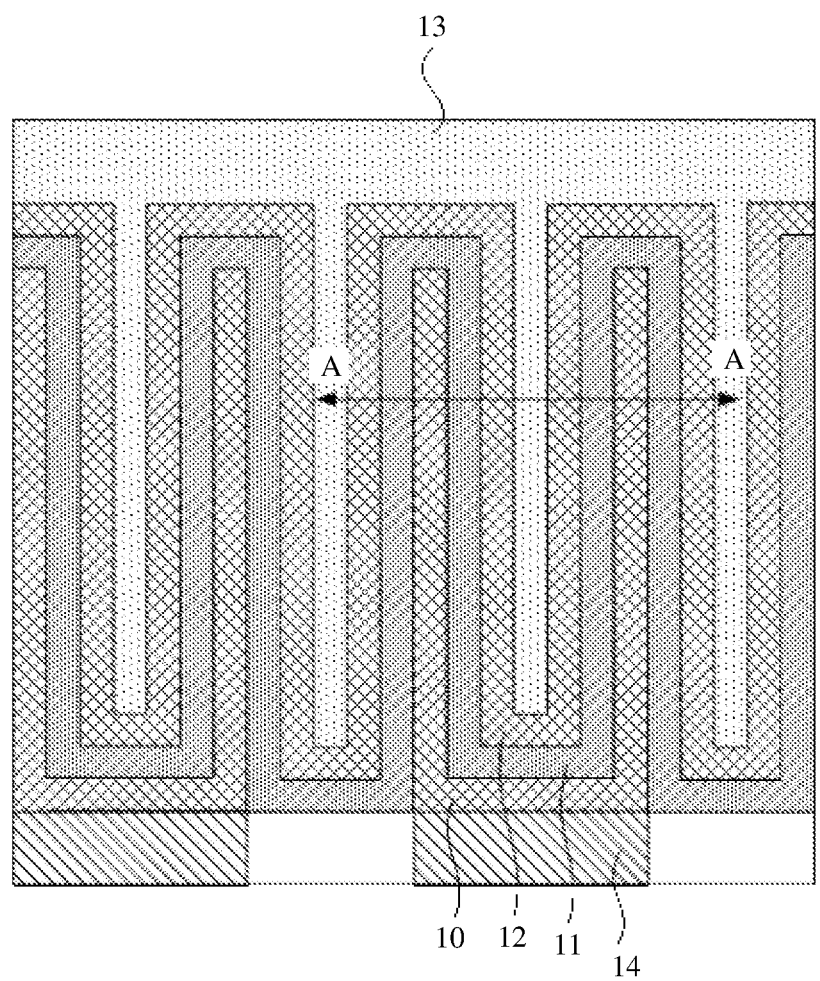
FIG. 1A is a cross-sectional view of a cylindrical double-sided capacitor in a Dynamic Random Access Memory (DRAM) in the related art.
Figure 1B:
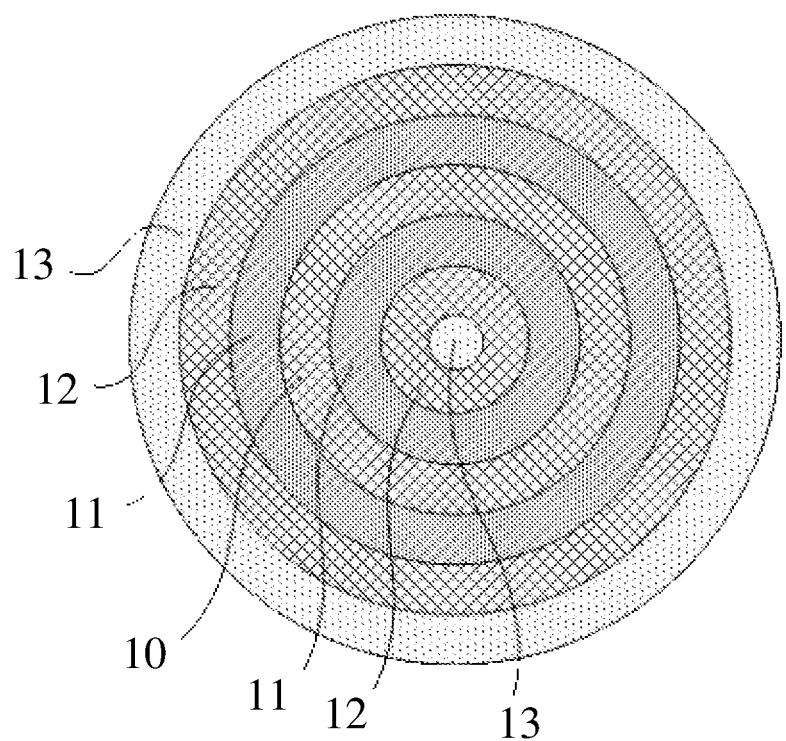
FIG. 1B is a partial top view along a line A-A in FIG. 1A.
Figure 2:
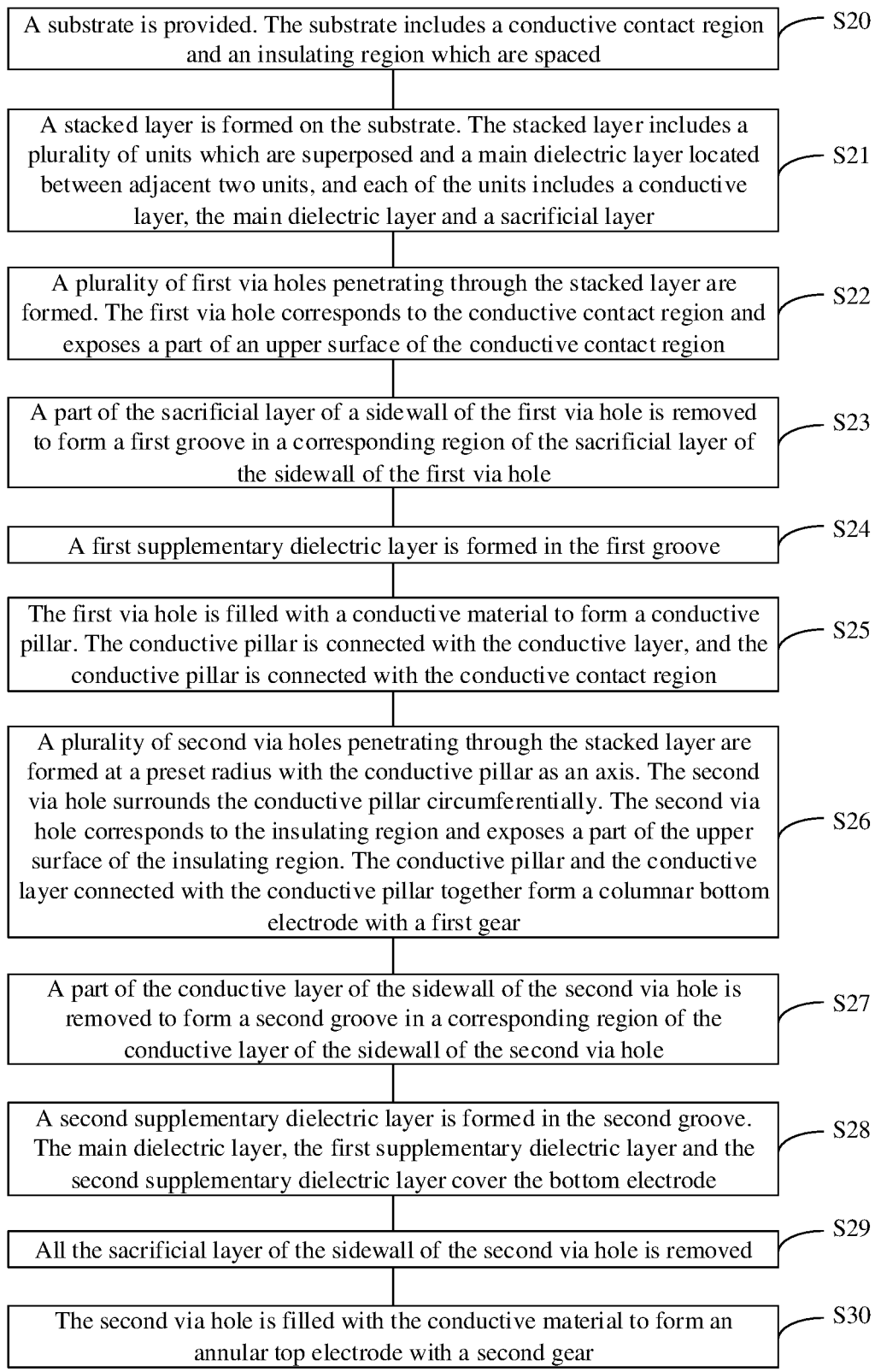
FIG. 2 is a schematic diagram of operations of one implementation mode of a method of preparing a capacitor structure according to an example of the present disclosure.

An example of the present disclosure provides a method of preparing a capacitor structure. FIG. 2 is a schematic diagram of operations of one implementation mode of a method of preparing a capacitor structure according to an example of the present disclosure. FIG. 3 to FIG. 25 are process flow diagrams of one implementation mode of a method of preparing a capacitor structure according to an example of the present disclosure. Referring to FIG. 2, the method of preparing a capacitor structure in the example of the present disclosure includes the following operations.

Figure 3:
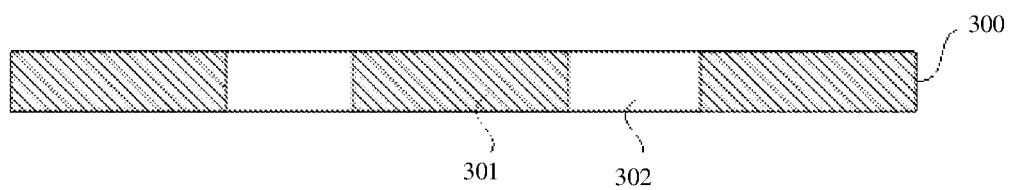
FIG. 3 to FIG. 25 are process flow diagrams of one implementation mode of a method of preparing a capacitor structure according to an example of the present disclosure.

Referring to operation S20 and FIG. 3, a substrate 300 is provided. The substrate 300 includes a conductive contact region 301 and an insulating region 302 which are spaced. A conductive contact pad may be formed in the substrate 300. The conductive contact pad serves as the conductive contact region 301. A region where the conductive contact pad is not disposed serves as the insulating region 302.

Figure 4:
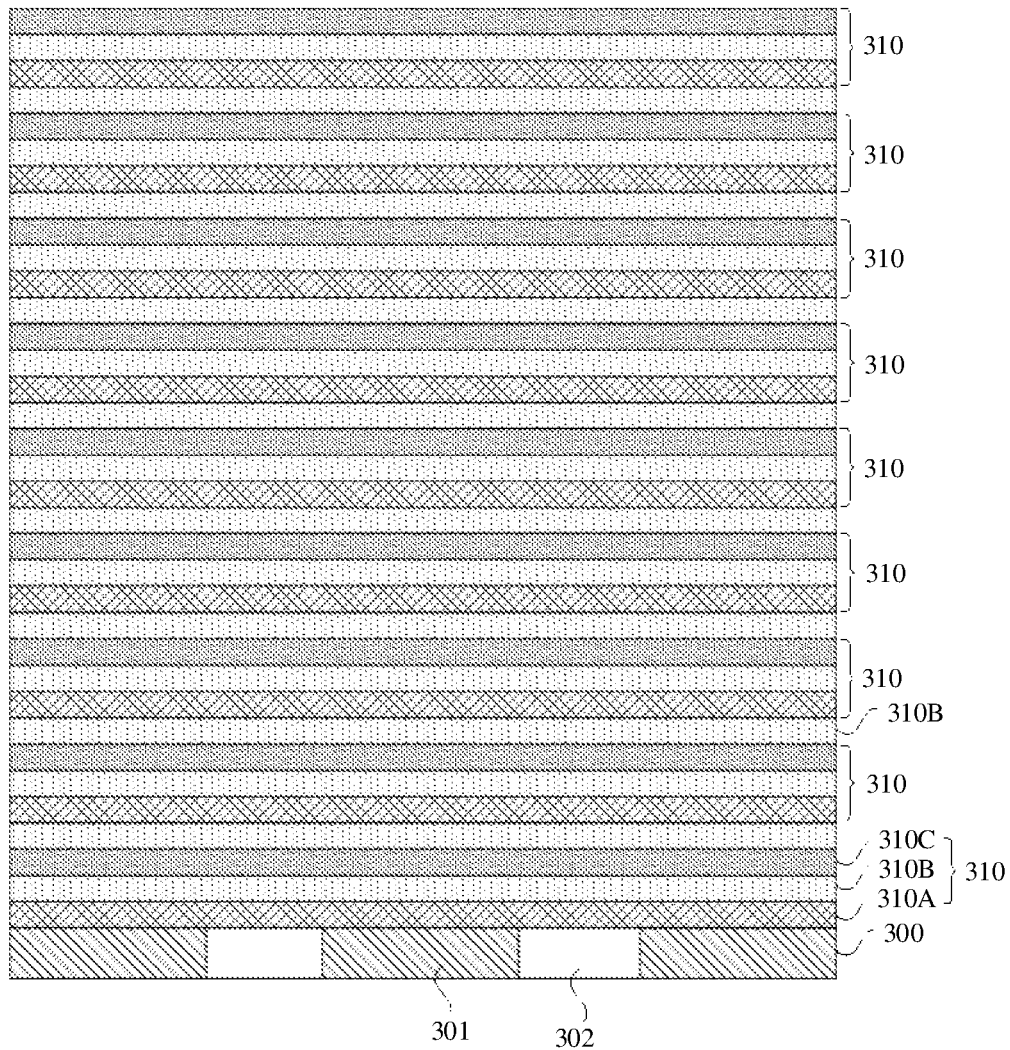

Referring to operation S21 and FIG. 4, a stacked layer is formed on the substrate 300. The stacked layer includes a plurality of superposed units 310 and a main dielectric layer 310B disposed between adjacent two units. Each of the units 310 includes a conductive layer 310A, a main dielectric layer 310B, and a sacrificial layer 310C. The main dielectric layer 310B is also formed between the units 310. In each of the units 310, the conductive layer 310A, the main dielectric layer 310B, and the sacrificial layer 310C are sequentially disposed. In some examples, the units 310 may be grown repeatedly on a same machine table. In the example of the present disclosure, the stacked layer includes at least two units.

Figure 8:
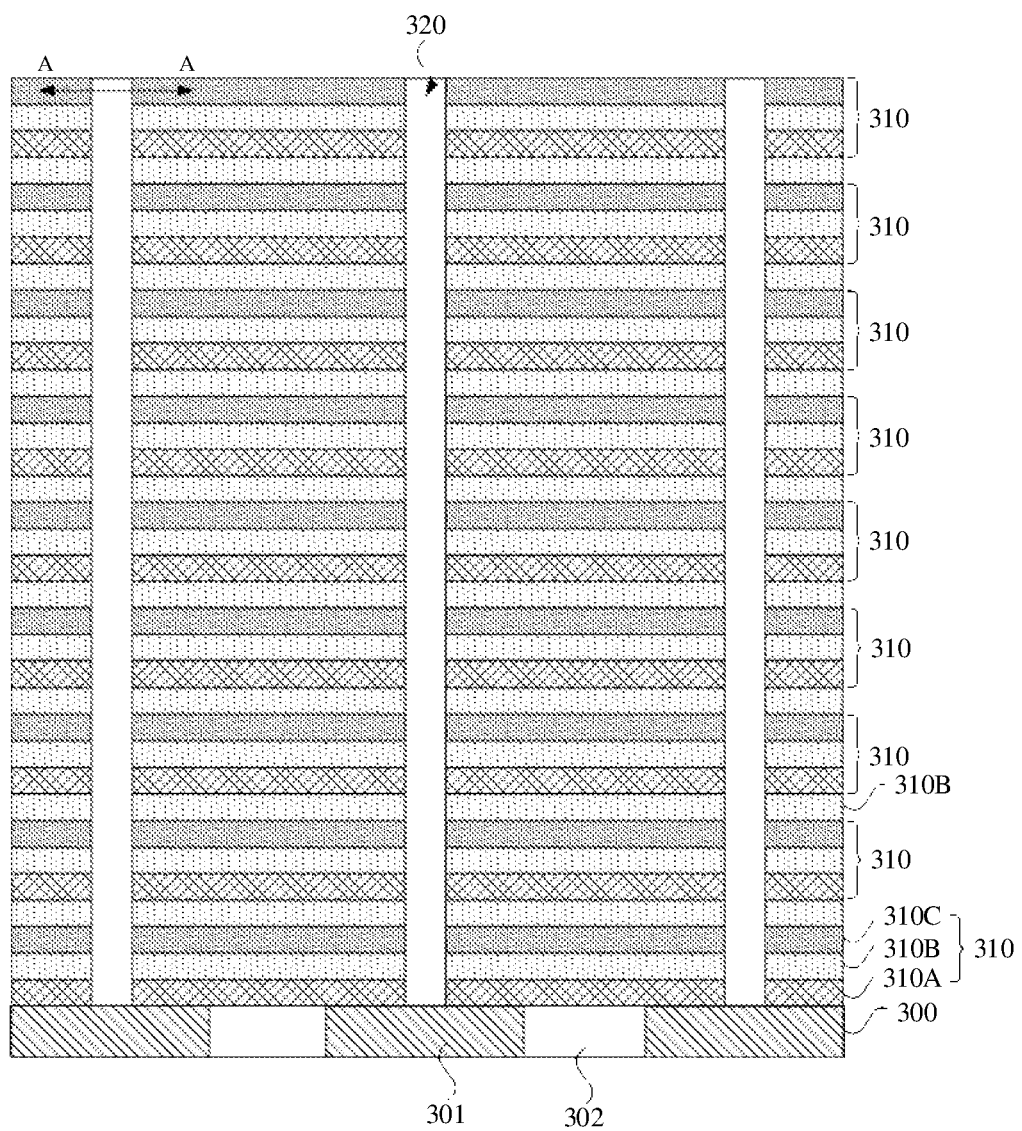

Referring to operation S22 and FIG. 8, a plurality of first via holes 320 penetrating through the stacked layer is formed. Each first via hole 320 corresponds to the conductive contact region 301 and exposes a part of an upper surface of the conductive contact region 301. In the example, two first via holes 320 are formed. In the example of the present disclosure, at least one first via hole penetrating the stacked layer is formed.

In an example of the present disclosure, the first via hole 320 is formed by using a photoetching and etching method. The description is as follows.

Figure 5:
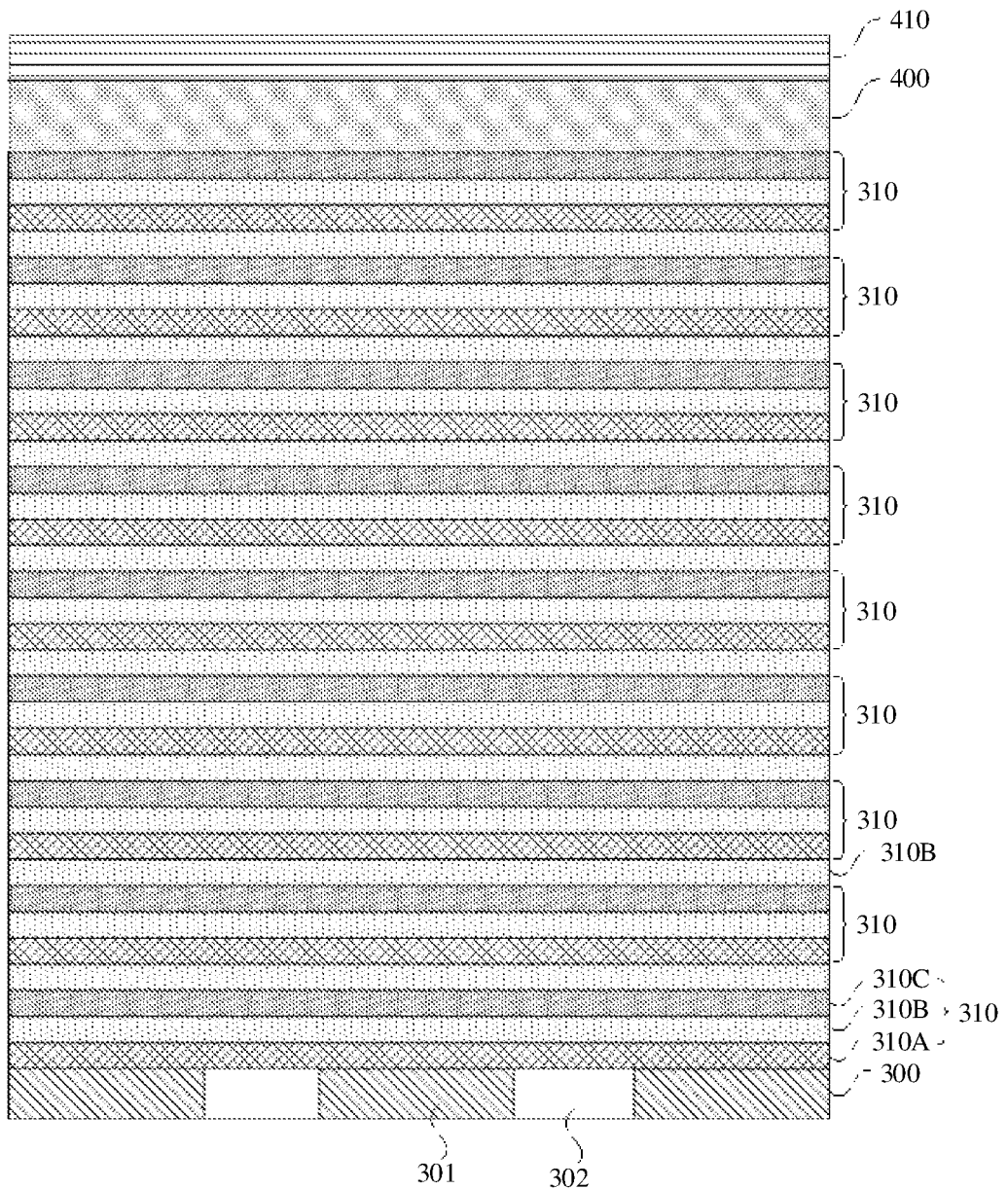

Referring to FIG. 5, a hard mask layer 400 and a photoresist layer 410 are formed on the stacked layer.

Figure 6:
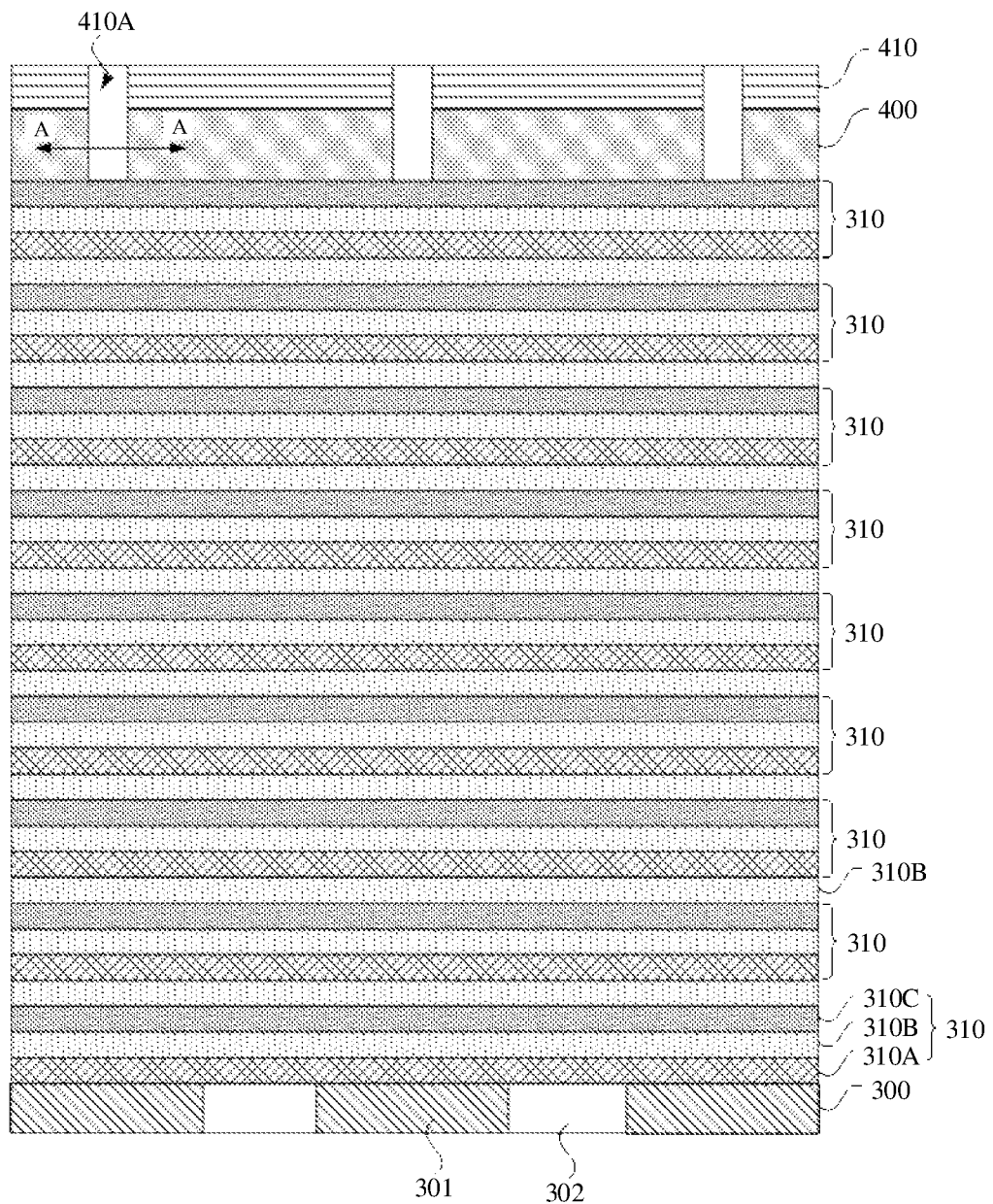
Figure 7:
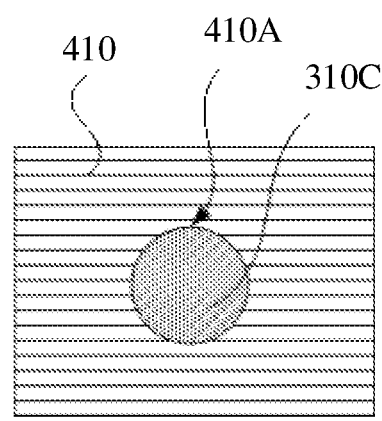

Referring to FIG. 6 and FIG. 7, FIG. 6 is a cross-sectional view, and FIG. 7 is a partial top view at a line A-A in FIG. 6. The photoresist layer 410 is patterned to form a window 410A, and a pattern is transferred to the hard mask layer 400 by using the window 410A. In this operation, the pattern may be transferred to the hard mask layer 400 by using a dry etching process. The dry etching process includes a plasma etching process, a reactive ion etching process, or an ion beam milling process.

Figure 9:
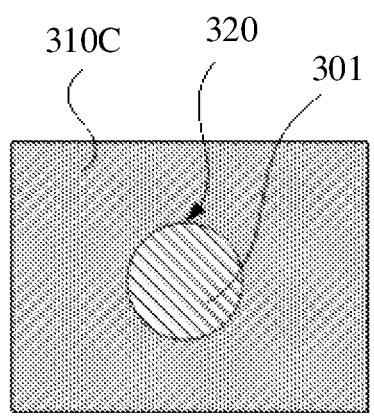

Referring to FIG. 8 and FIG. 9, FIG. 8 is a cross-sectional view and FIG. 9 is a partial top view at a line A-A in FIG. 8. The stacked layer is etched by using the hard mask layer 400 as a mask to form the first via hole 320 penetrating through the stacked layer. In this operation, high depth-to-width ratio etching is performed on the stacked layer. The etching rate of an etching material to the stacked layer needs to be greater than the etching rate to the hard mask layer 400 and the substrate 300. In some examples, the photoresist layer 410 and the hard mask layer 400 may be consumed during the etching. If the photoresist layer 410 and the hard mask layer 400 are remained after the first via hole 320 is formed, the photoresist layer 410 and the hard mask layer 400 are removed by using a wet etching process.

In the example of the present disclosure, the diameter of the first via hole 320 is the same as the diameter of a conductive pillar 340 (shown in FIG. 14) to be formed subsequently. The distance between the axes of adjacent two first via holes 320 is the same as the distance between the axes of adjacent two conductive pillars 340. In other implementation modes of the example of the present disclosure, the diameter of the first via hole 320 is smaller than the diameter of the conductive pillar 340 to be formed subsequently.

Figure 10:
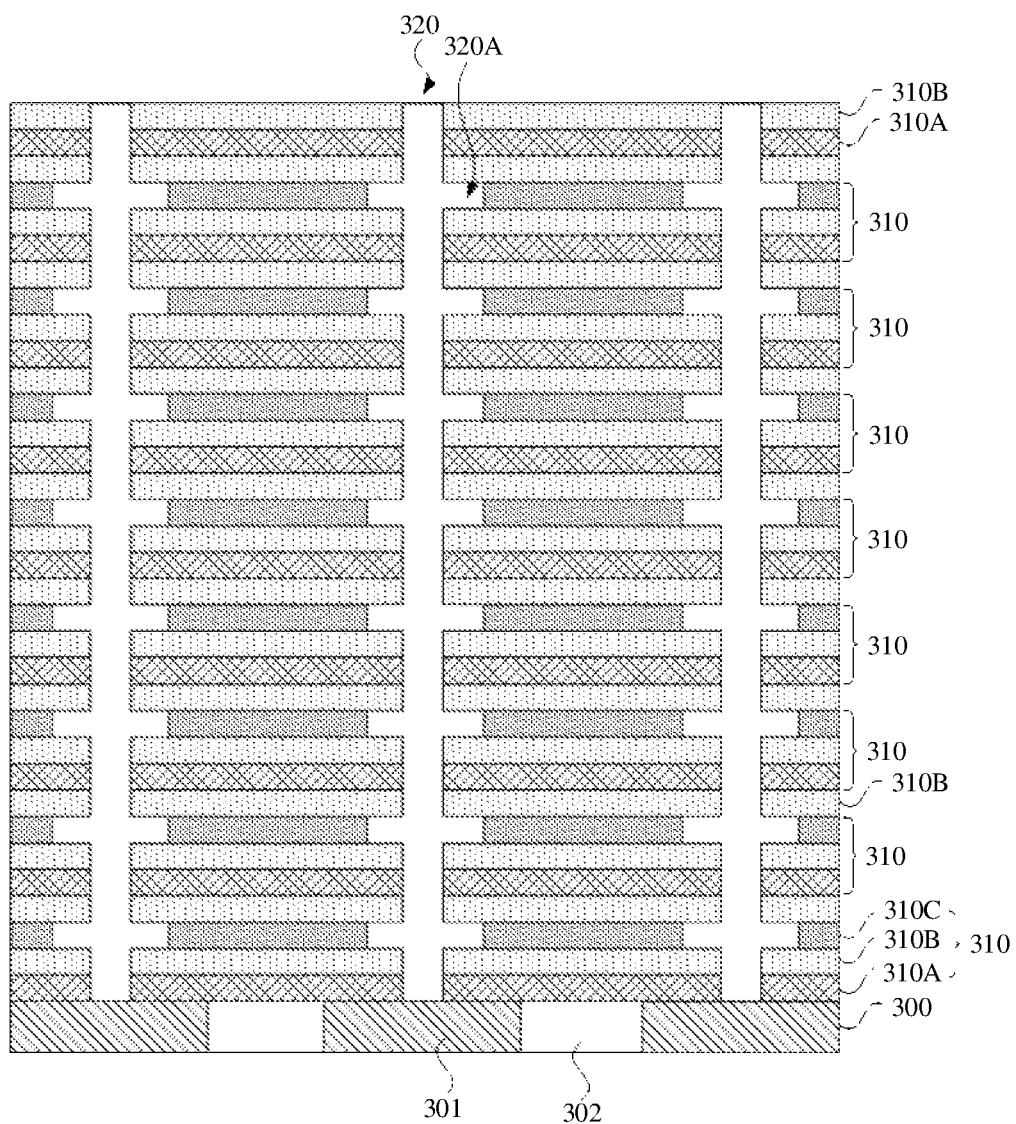

Referring to S23 and FIG. 10, a part of the sacrificial layer 310C of a sidewall of the first via hole 320 is removed to form a first groove 320A in a corresponding region of the sacrificial layer 310C of the sidewall of the first via hole 320. In this operation, the sacrificial layer 310C may be removed by using the wet etching process. In a direction that the sacrificial layer 310C extends, the sacrificial layer 310C is partially removed, such that a part of the surface of the main dielectric layer 310B adjacent to the sacrificial layer 310C is exposed. As a result, a first groove 320A is delimited by adjacent two main dielectric layers 310B and the sacrificial layer 310C.

In the example of the present disclosure, since the topmost layer of the stacked layer is the sacrificial layer 310C, in the operation that a part of the sacrificial layer 310C of a sidewall of the first via hole 320 is removed, the topmost sacrificial layer 310C is removed at the same time to expose the main dielectric layer 310B below the sacrificial layer 310C. In other implementation modes of the example of the present disclosure, the topmost sacrificial layer 310C may not be removed.

Figure 12:
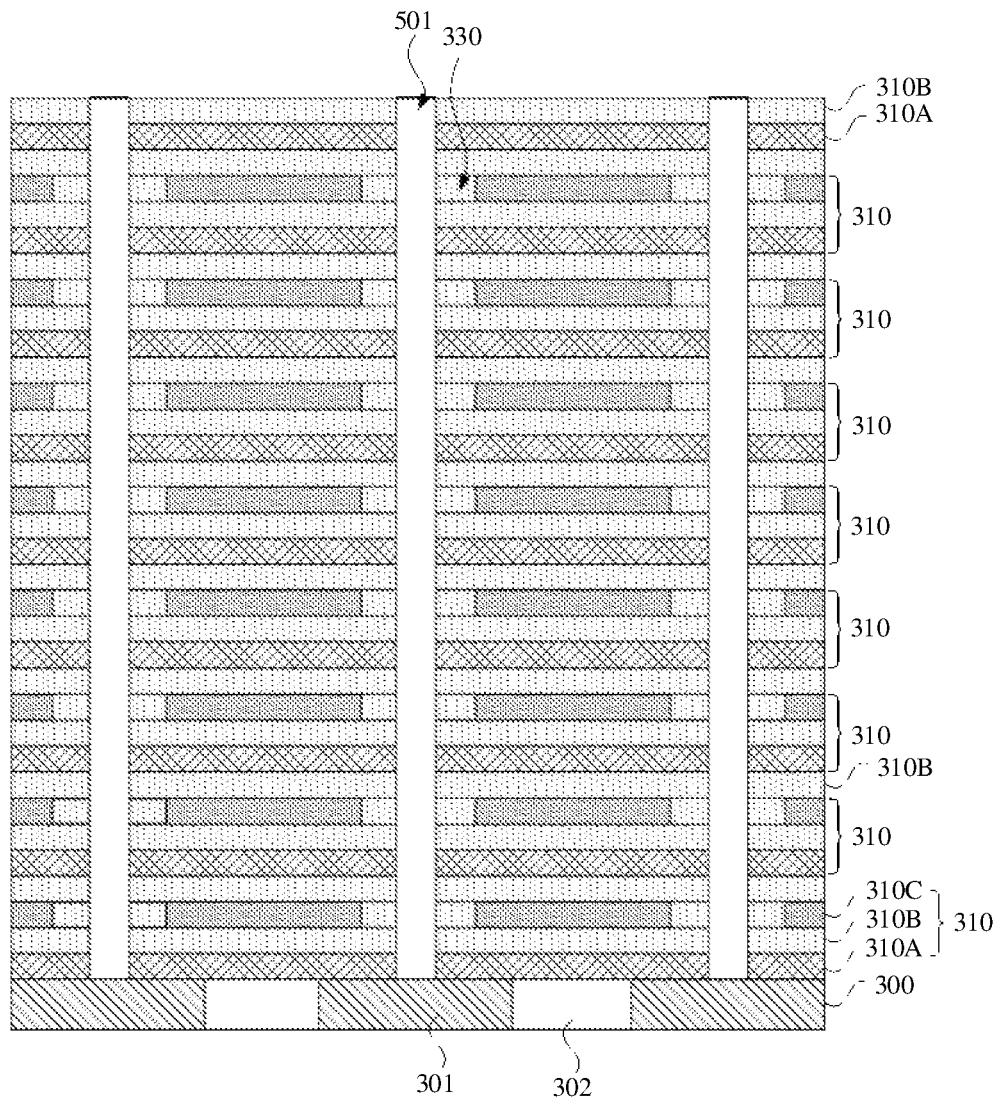

Referring to operation S24 and FIG. 12, a first supplementary dielectric layer 330 is formed in the first groove 320A. The first groove 320A is filled with the first supplementary dielectric layer 330. In the example of the present disclosure, the material of the first supplementary dielectric layer 330 is the same as the material of the main dielectric layer 310B.

An example of the present disclosure enumerates a method of forming the first supplementary dielectric layer 330 in the first groove 320A. The description is as follows.

Figure 11:
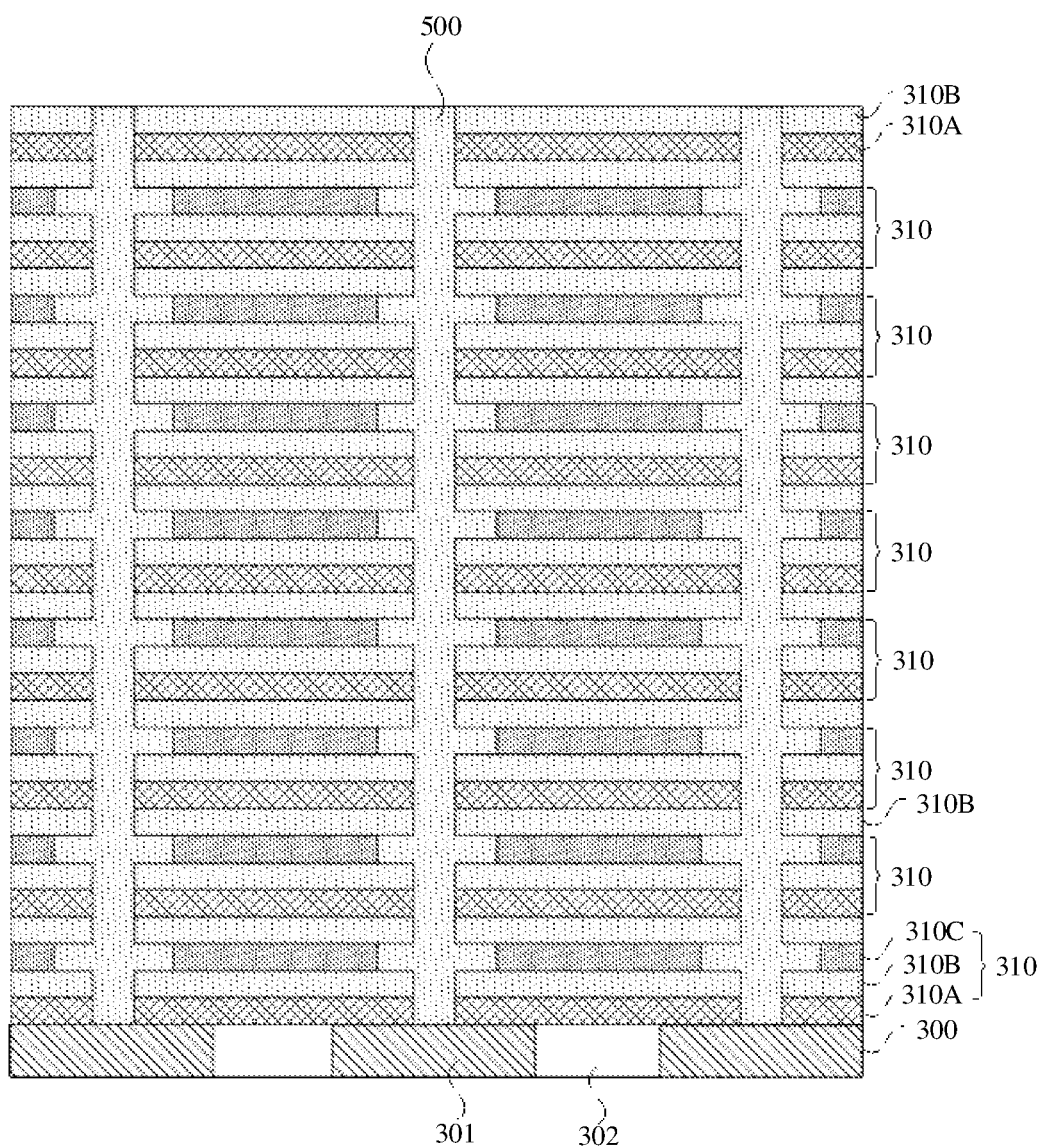

Referring to FIG. 11, the first via hole 320 is filled with a dielectric material 500. The dielectric material 500 fills up the first via hole 320. It will be appreciated that, for process reasons, during filling the dielectric material 500, the topmost exposed main dielectric layer 310B is also covered by the dielectric material. After the dielectric material 500 is filled, a surface of the main dielectric layer 310B is chemically and mechanically polished to remove the dielectric material on the surface of the main dielectric layer 310B. In some examples, the material of the main dielectric layer 310B is the same as the dielectric material.

Referring to FIG. 12, a through hole 501 penetrating through the dielectric material 500 is formed. After the through hole 501 is formed, the dielectric material located in the first groove 320A is remained, and the dielectric material in other regions is removed. The dielectric material in the first groove 320A serves as the first supplementary dielectric layer 330. After the through hole 501 is formed, side surfaces of the conductive layer 310A and the main dielectric layer 310B are exposed at the sidewall of the through hole 501. The side surface of the sacrificial layer 310C is covered by the first supplementary dielectric layer 330 and is not exposed at the sidewall of the through hole 501. The through hole 501 is coaxial with the first via hole 320. The diameter of the through hole 501 is greater than or equal to the diameter of the first via hole 320. The diameter of the through hole 501 is the same as the diameter of the conductive pillar 340 to be formed subsequently.

Figure 14:
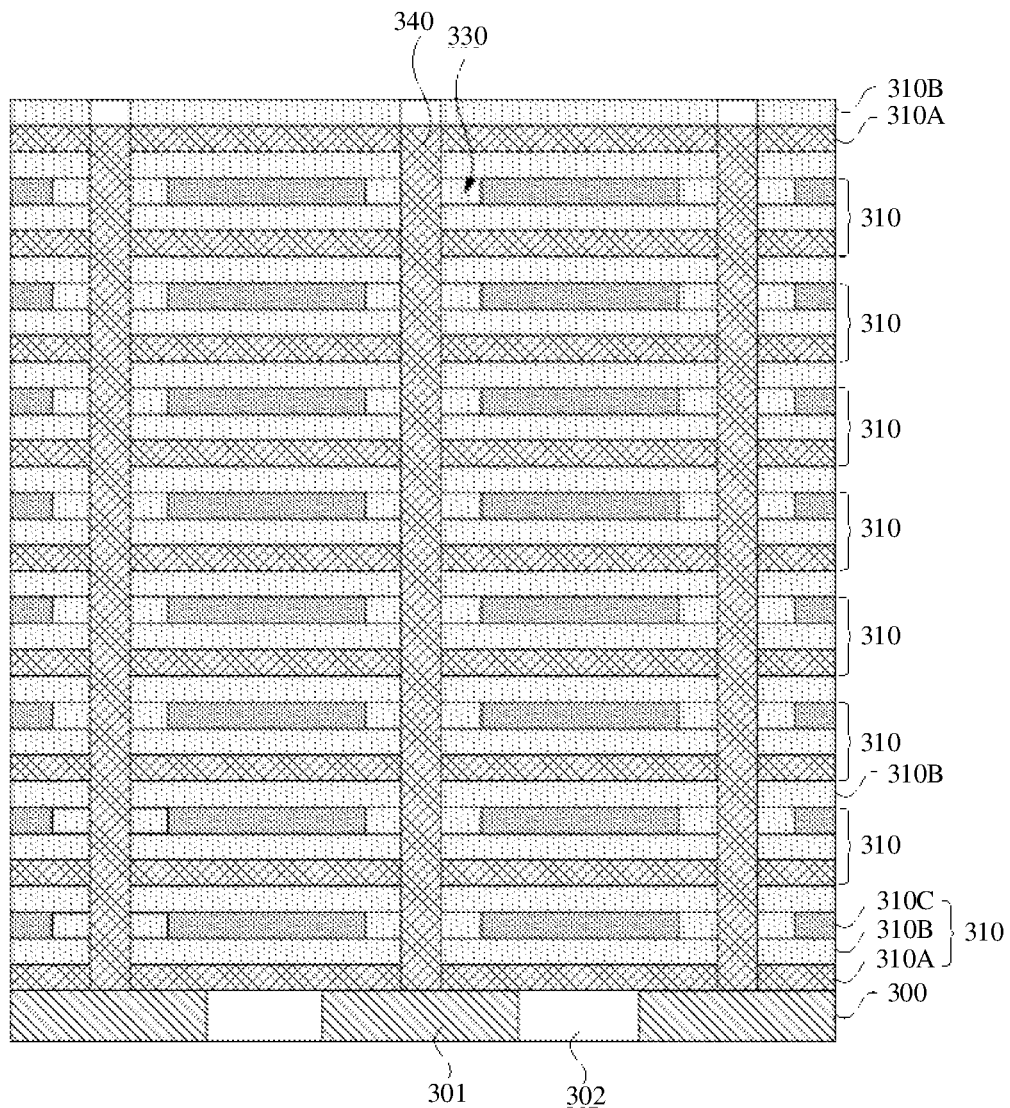

Referring to operation S25 and FIG. 14, the first via hole 320 is filled with a conductive material to form a conductive pillar 340. The conductive pillar 340 is connected with the conductive layer 310A, and the conductive pillar 340 is connected with the conductive contact region 301. In the example of the present disclosure, the conductive material forming the conductive pillar 340 is the same as the material of the conductive layer 310A.

An example of the present disclosure provides a method of forming the conductive pillar 340. The description is as follows.

Figure 13:
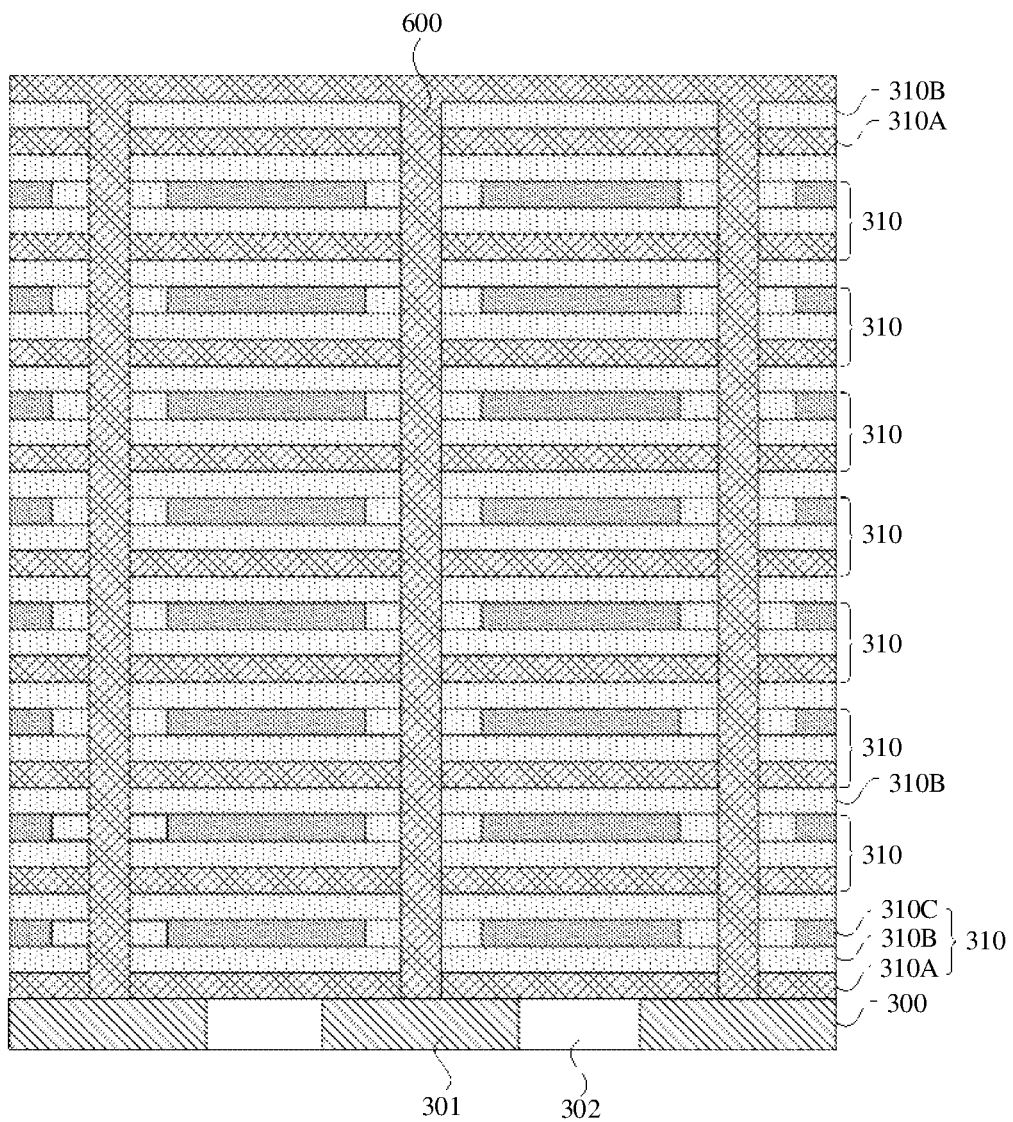

Referring to FIG. 13, the first via hole 320 is filled with the conductive material 600. The conductive material 600 fills up the first via hole 320 and covers an upper surface of the main dielectric layer 310B.

Referring to FIG. 14, a part of the conductive material 600 is removed to expose the upper surface of the main dielectric layer 310B to form the conductive pillar 340. The upper surface of the conductive pillar 340 is flush with the conductive layer 310A below the main dielectric layer 310B. In this operation, the conductive material 600 is etched back to form the conductive pillar 340.

Figure 15:
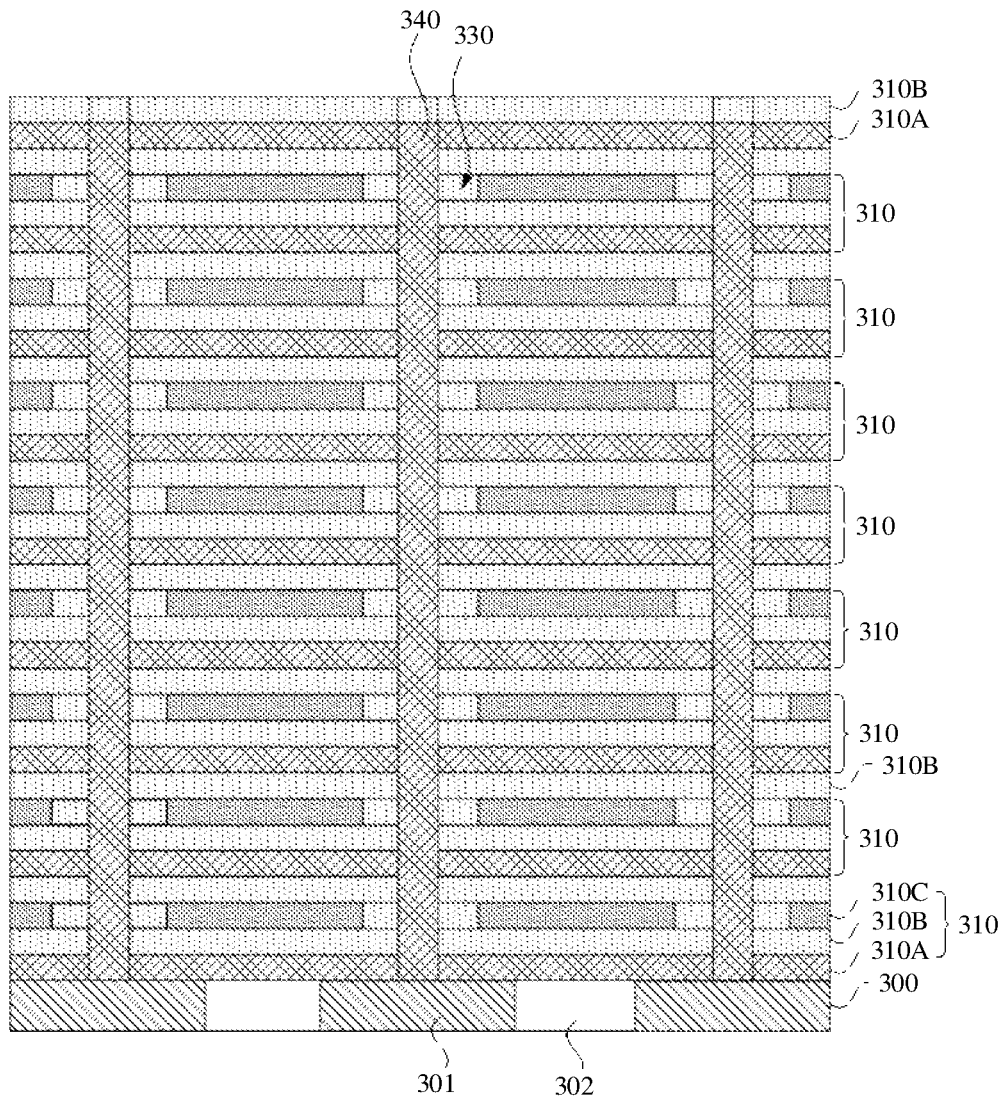

In some examples, since the upper surface of the conductive pillar 340 is flush with the conductive layer 310A below the main dielectric layer 310B, a region of the topmost main dielectric layer 310B corresponding to the conductive pillar 340 is not filled and has a gap. Therefore, the example of the present disclosure may further include the following operations. Referring to FIG. 15, after the conductive pillar 340 is formed, the dielectric material is deposited on the main dielectric layer 310B. The dielectric material is filled at least above the conductive pillar. In the example of the present disclosure, the dielectric material fills the gap of the region of the topmost main dielectric layer 310B corresponding to the conductive pillar 340. It will be appreciated that, for process reasons, the surface of the main dielectric layer 310B may also be covered with the dielectric material. The dielectric material located on the surface of the main dielectric layer 310B may be removed and the surface of the main dielectric layer 310B may be planarized by a process such as chemical mechanical polishing.

Figure 19:
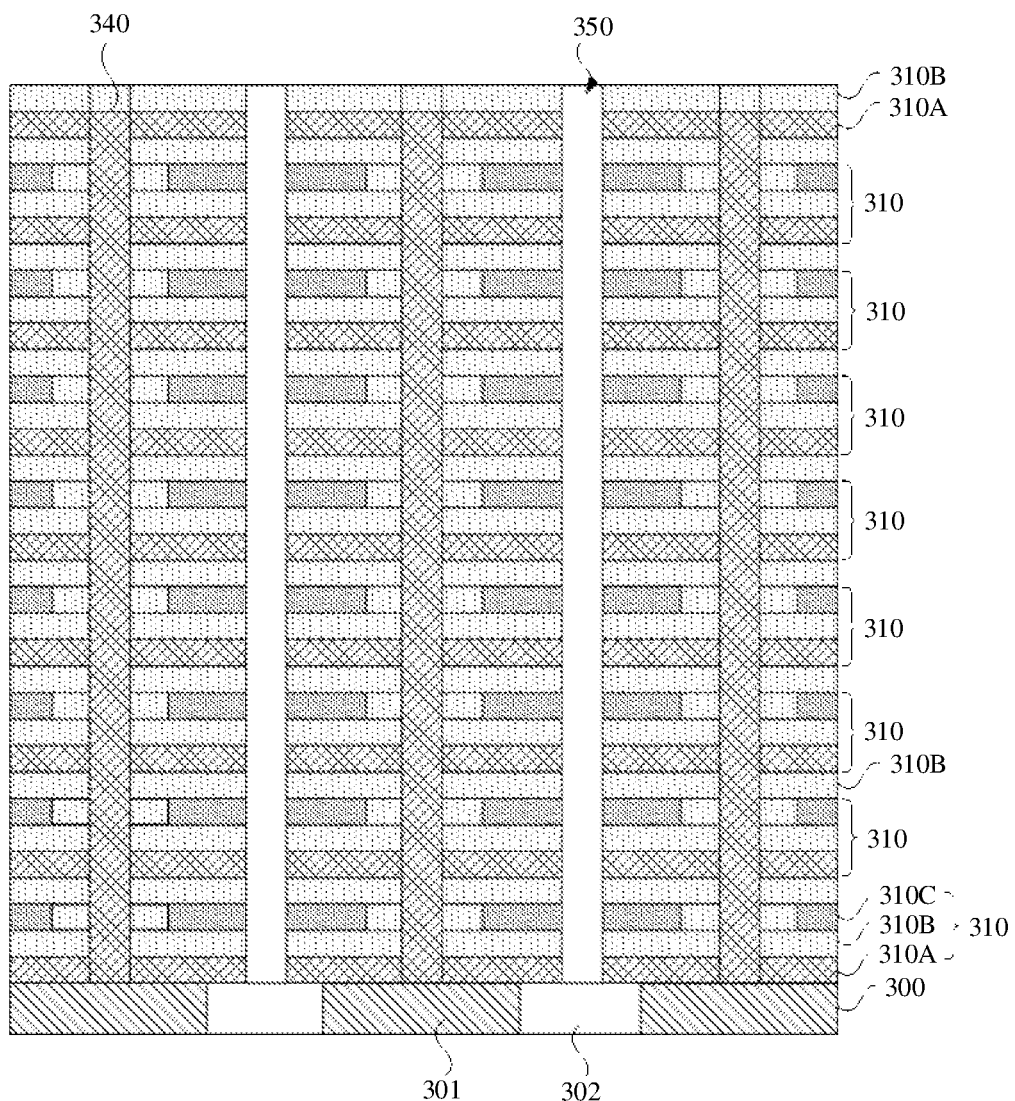

Referring to operation S26 and FIG. 19, a plurality of second via holes 350 penetrating through the stacked layer are formed at a preset radius by taking the conductive pillar 340 as an axis. The second via hole 350 surrounds the conductive pillar 340. The second via hole 350 corresponds to the insulating region 302 and exposes a part of the upper surface of the insulating region 302. The conductive pillar 340 and the conductive layer 310A connected to the conductive pillar 340 together serve as a cylindrical bottom electrode 360 with first gears 361 (shown in FIG. 25), in which the conductive layer 310A serves as the first gears 361. In the example of the present disclosure, at least one second via hole penetrating through the stacked layer is formed.

An example of the present disclosure provides a method of forming the second via hole 350. The description is as follows.

Figure 16:
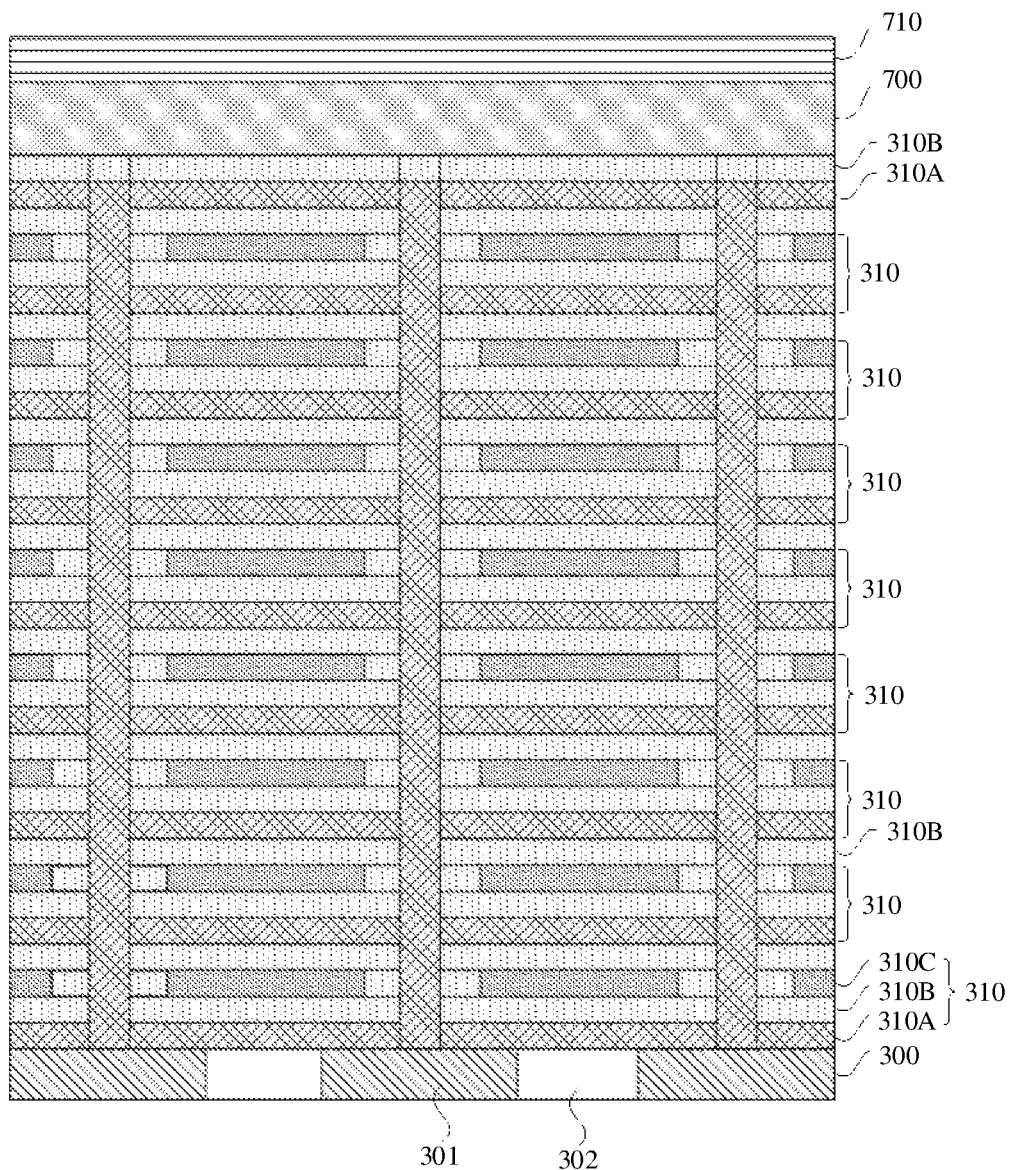

Referring to FIG. 16, a hard mask layer 700 and a photoresist layer 710 are formed on the topmost main dielectric layer 310B.

Figure 17:
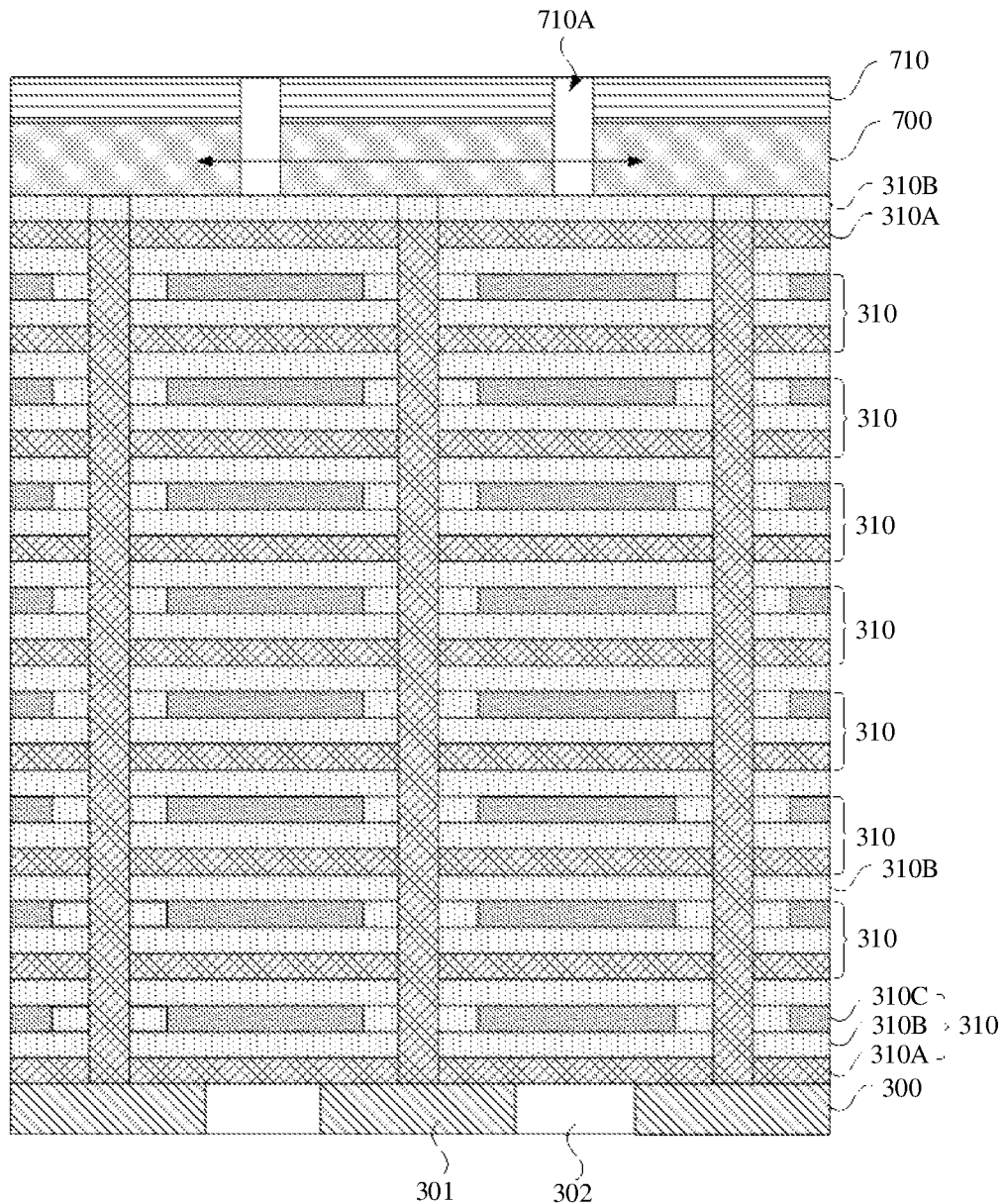
Figure 18:
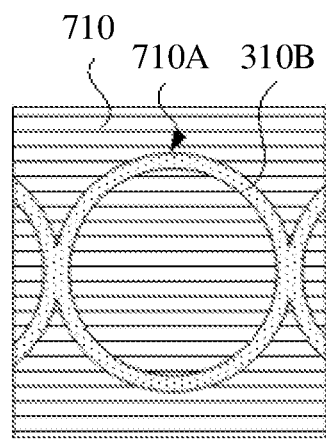

Referring to FIG. 17 and FIG. 18, FIG. 17 is a cross-sectional view, and FIG. 18 is a partial top view at a line A-A in FIG. 17. The photoresist layer 710 is patterned to form a window 710A, and the pattern is transferred to the hard mask layer 700 by using the window 710A. In this operation, the pattern may be transferred to the hard mask layer 700 by using the dry etching process. In the operation, the pattern transferred to the hard mask layer 700 is an annular pattern surrounding the conductive pillar 340 with a preset radius and corresponds to the insulating region 302.

Referring to FIG. 19, the stacked layer is etched by taking the hard mask layer 700 as a mask to form the second via hole 350 penetrating through the stacked layer. The shape of the second via hole 350 formed in this operation is the same as the shape of the window 710A in FIG. 18. In the operation, high depth-to-width ratio etching is performed on the stacked layer. The etching rate of an etching material to the stacked layer needs to be greater than the etching rate to the hard mask layer 700 and the substrate 300. In some examples, the photoresist layer 710 and the hard mask layer 700 may be consumed during the etching. If the photoresist layer 710 and the hard mask layer 700 are remained after the second via hole 350 is formed, the photoresist layer 710 and the hard mask layer 700 are removed by using the wet etching process.

In the example of the present disclosure, the axis of the second via hole 350 coincides with the axis of the annular main body of the subsequently formed top electrode. The width of the second via hole 350 is the same as the width of the annular main body. In other implementation modes of the example of the present disclosure, the width of the second via hole 350 is smaller than the width of the annular main body.

Figure 20:
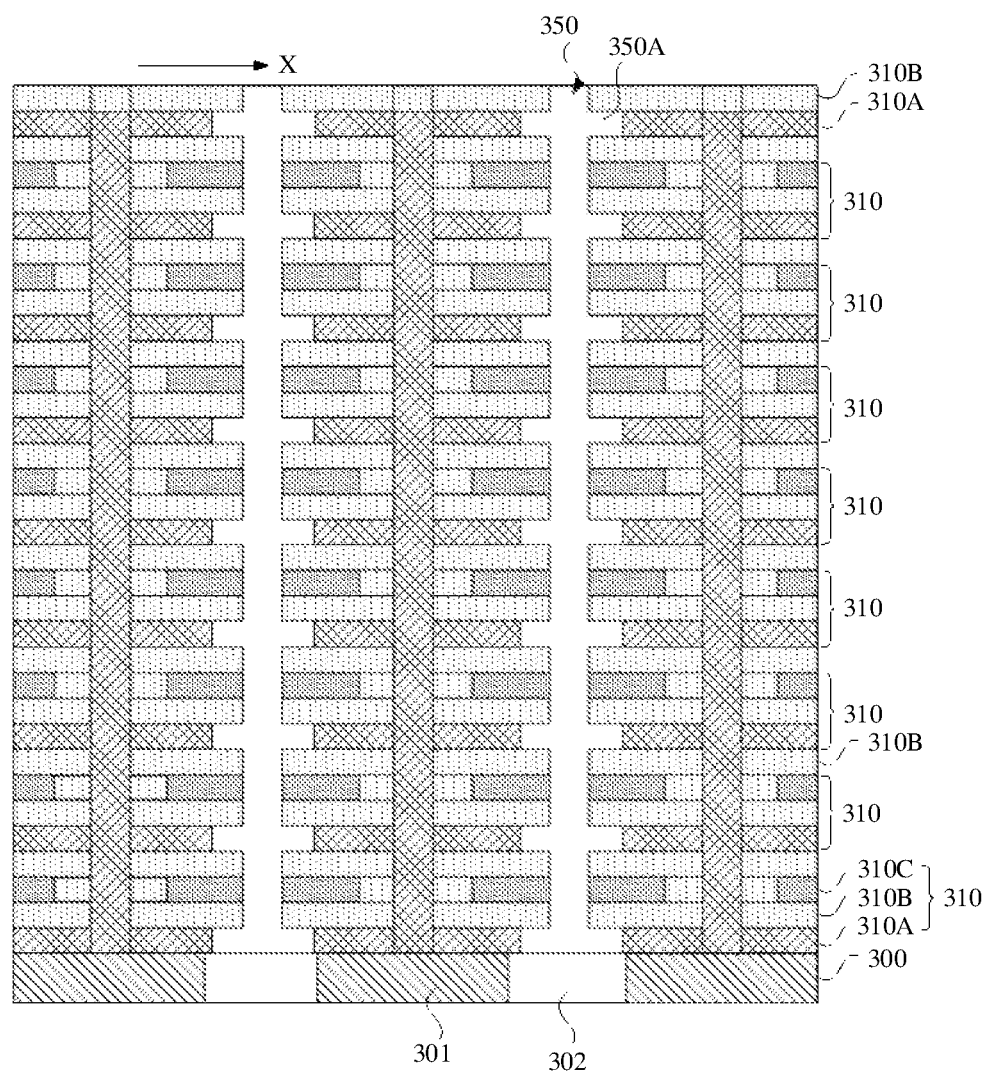

Referring to operation S27 and FIG. 20, a part of the conductive layer 310A of the sidewall of the second via hole 350 is removed to form a second groove 350A in a corresponding region of the conductive layer 310A of the sidewall of the second via hole 350. In this operation, the conductive layer 310A may be removed by using the wet etching process, and the main dielectric layer 310B and the sacrificial layer 310C will not be removed. The second groove 350A is delimited by the adjacent main dielectric layers 310B and the conductive layer 310A therebetween. In some examples, in this operation, the width of the removed conductive layer 310A (along an extension direction of the conductive layer 310A, a direction X as shown in FIG. 20) is smaller than the width of the sacrificial layer 310C to form overlapped first gear 361 and second gear 382 in a subsequent operation.

Figure 22:
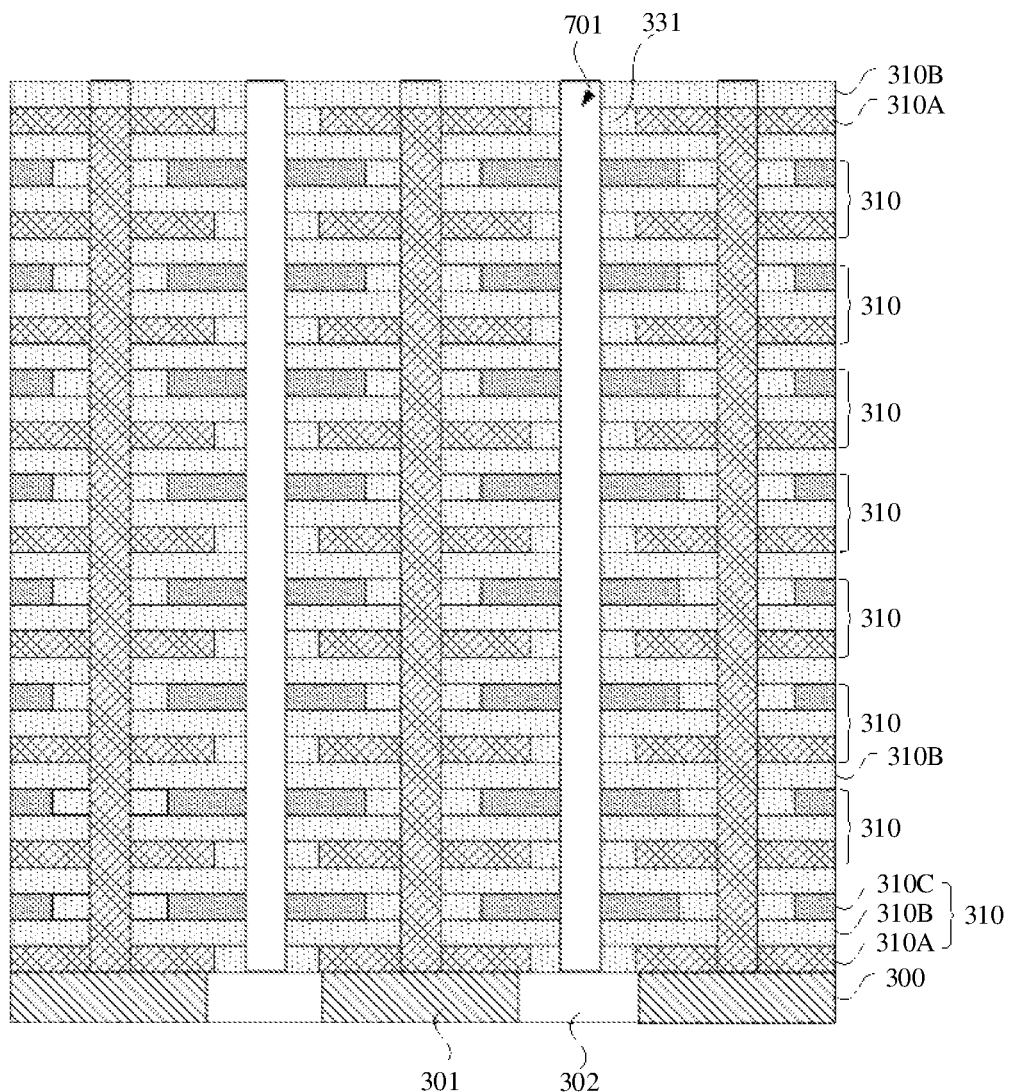

Referring to operation S28 and FIG. 22, a second supplementary dielectric layer 331 is formed in the second groove 350A. The main dielectric layer 310B, the first supplementary dielectric layer 330, and the second supplementary dielectric layer 331 together cover the bottom electrode 360. The second groove 350A is filled with the second supplementary dielectric layer 331, so that the main dielectric layer 310B, the first supplementary dielectric layer 330, and the second supplementary dielectric layer 331 together form a closed dielectric layer 370, thereby electrically insulating the bottom electrode 360 and the top electrode to be formed subsequently. In the example of the present disclosure, the material of the second supplementary dielectric layer 331 is the same as the material of the main dielectric layer 310B.

An example of the present disclosure further provides a method of forming the second supplementary dielectric layer 331. The description is as follows.

Figure 21:
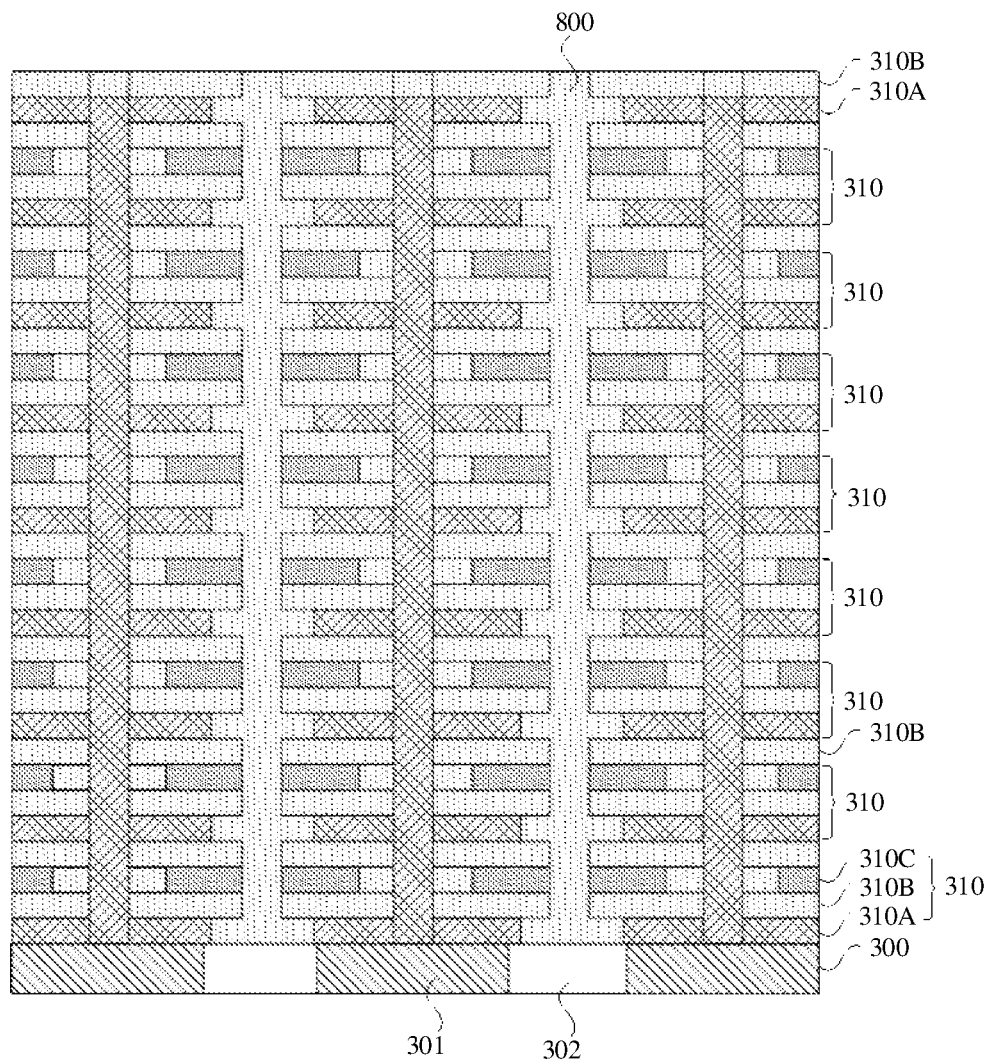

Referring to FIG. 21, the second via hole 350 is filled with the dielectric material 800. The dielectric material 800 fills up the second via hole 350. It will be appreciated that, for process reasons, during filling the dielectric material 800, the topmost exposed main dielectric layer 310B is also covered by the dielectric material. After the dielectric material 800 is filled, a surface of the main dielectric layer 310B is chemically and mechanically polished to remove the dielectric material on the surface of the main dielectric layer 310B. In some examples, the material of the main dielectric layer 310B is the same as the dielectric material.

Referring to FIG. 22, an annular through hole 701 penetrating through the dielectric material 800 is formed. After the through hole 701 is formed, the dielectric material located in the second groove 350A is remained, and the dielectric material in other regions is removed. The dielectric material in the second groove 350A serves as the second supplementary dielectric layer 331. After the through hole 701 is formed, side surfaces of the main dielectric layer 310B, the sacrificial layer 310C, and the second supplementary dielectric layer 331 are exposed at the sidewall of the through hole 701. The side surface of the conductive layer 310A is covered by the second supplementary dielectric layer 331 and will not be exposed at the sidewall of the through hole 701. The through hole 701 is coaxial with the second via hole 350. The width of the through hole 701 is greater than or equal to the width of the second via hole 350. The width of the through hole 701 is the same as the width of the annular main body of the top electrode to be formed subsequently.

Figure 23:
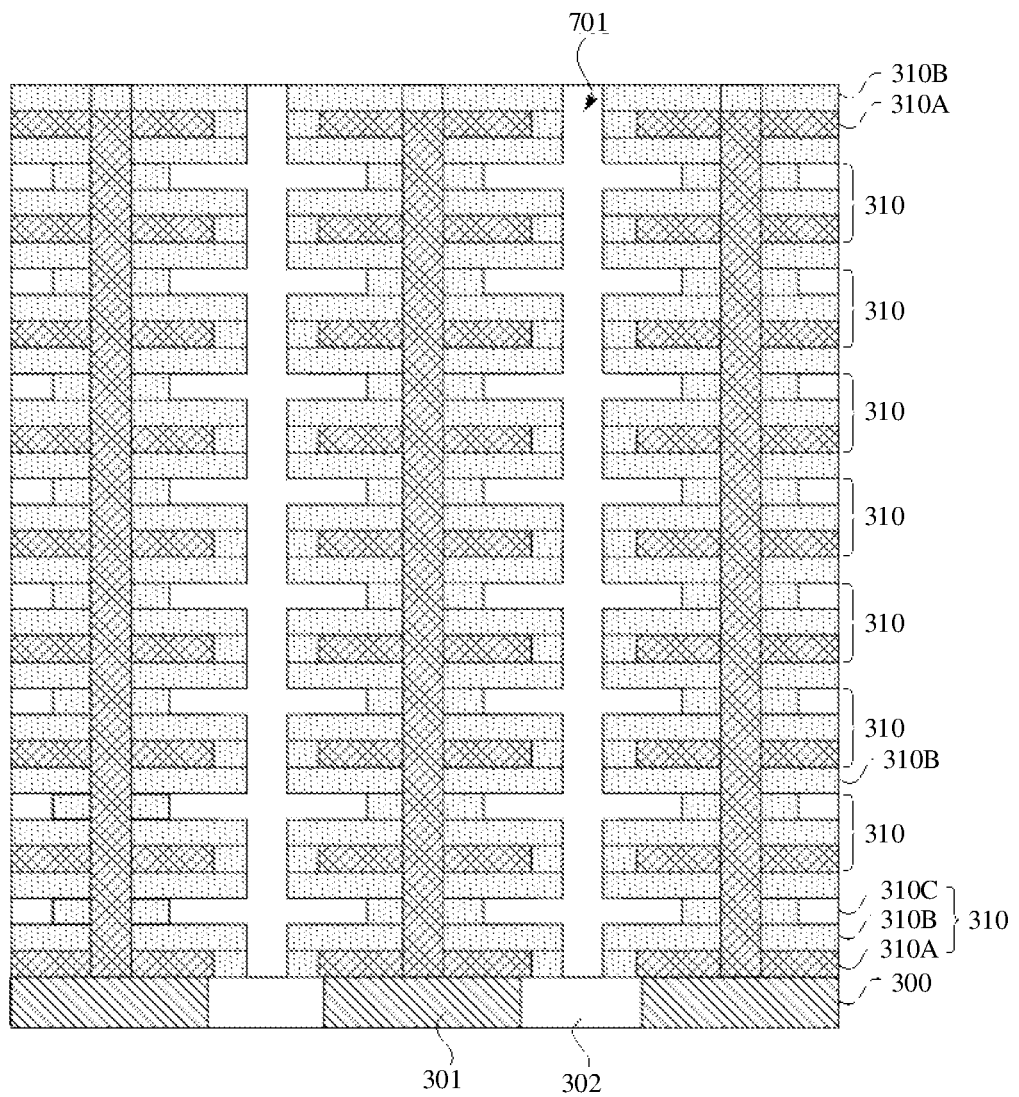

Referring to operation S29 and FIG. 23, all the sacrificial layer 310C of the sidewall of the second via hole 350 is removed. In this operation, the sacrificial layer 310C may be removed by using the wet etching process. A region where the sacrificial layer 310C is located may serve as a second gear region of the top electrode.

Figure 24:
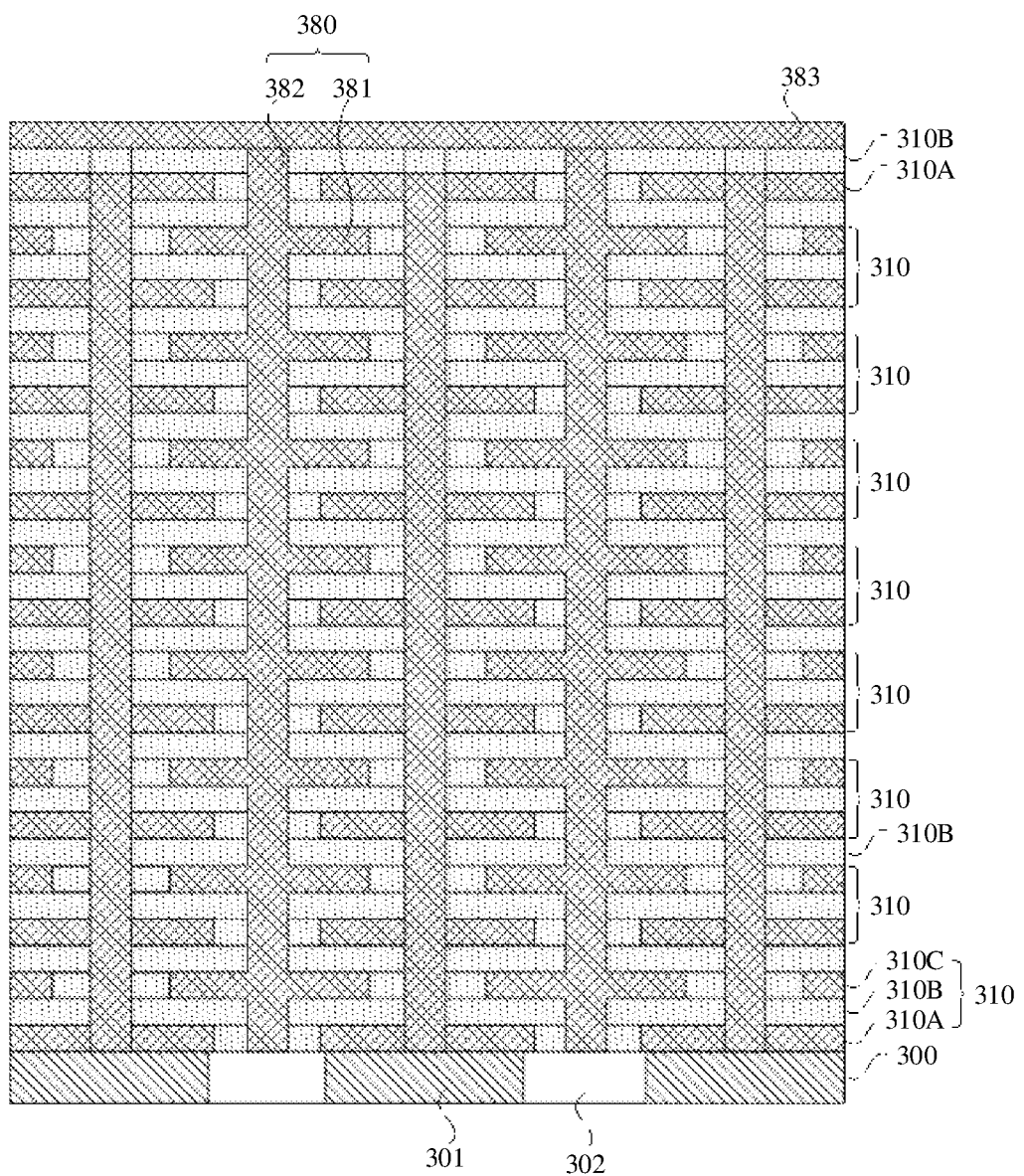

Referring to operation S30 and FIG. 24, the second via hole 350 is filled with the conductive material to form an annular top electrode 380 with the second gear 382. The conductive material filled in a region from which the sacrificial layer is removed forms the second gear 382, and the conductive material filled in the second via hole 350 forms the annular main body 381 of the annular top electrode.

In some examples, at operation S30, when the second via hole is filled with the conductive material to form the annular top electrode with the second gear, the conductive material covers the upper surface of the stacked layer to form a conductive connection layer 383. After operation S30, referring to FIG. 25, a top plate 390 is formed on the upper surface of the conductive connection layer 383. The conductive connection layer 383 serves as a connection layer of the top electrode 380 and the top plate 390.

In some examples of the present disclosure, the first gear 361 and the second gear 382 may be overlapped. The overlapping amount of the first gear 361 and the second gear 382 may be controlled by controlling the depths of the first groove 320A and the second groove 350A.

The cross area of the top electrode and the bottom electrode of the capacitor structure prepared by the method provided by the example of the present disclosure is increased, capacitance of the capacitor structure is increased, a shape deviation of the top electrode and the bottom electrode is small, and a design requirement is met.

Figure 25:
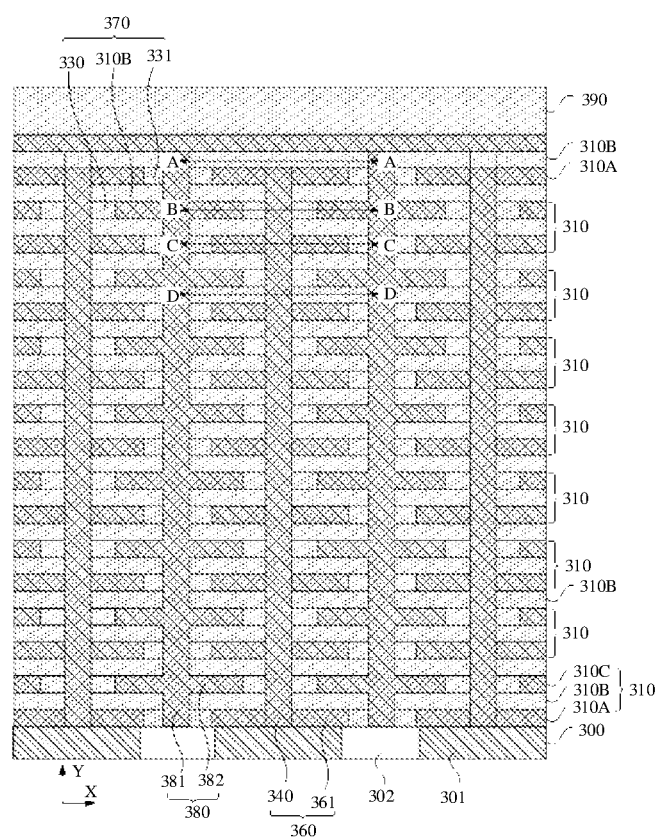
Figure 26:
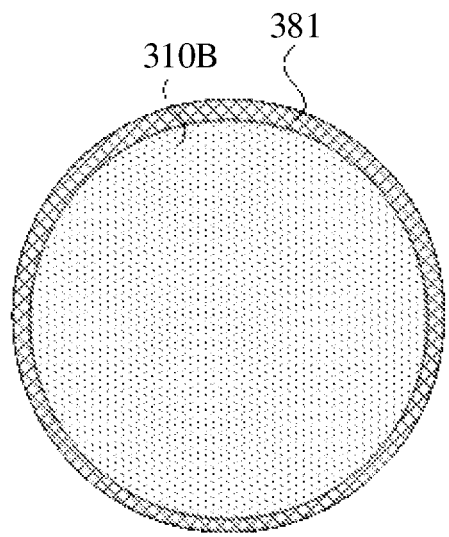
FIG. 26 is a partial top view at a line A-A in FIG. 25.
Figure 27:
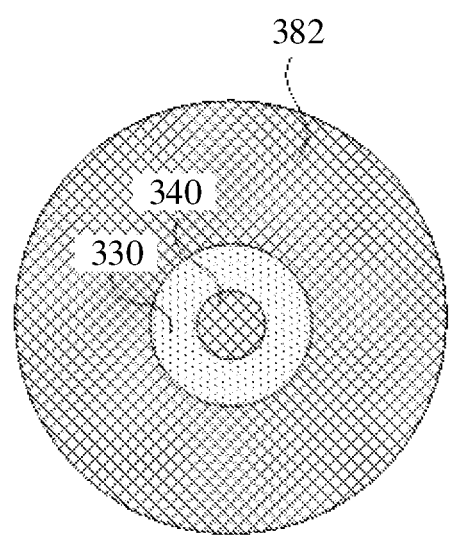
FIG. 27 is a partial top view at a line B-B in FIG. 25.
Figure 28:
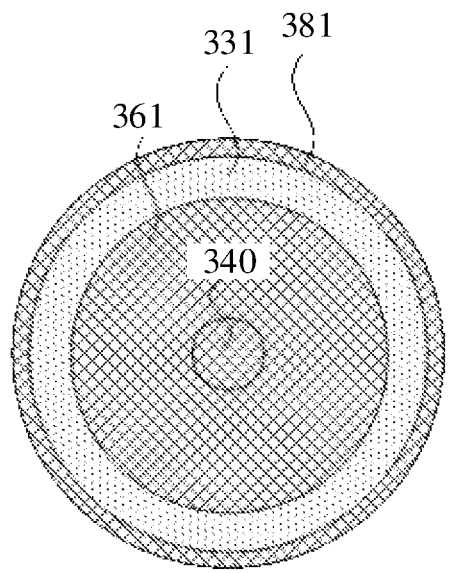
FIG. 28 is a partial top view at a line C-C in FIG. 25.
Figure 29:
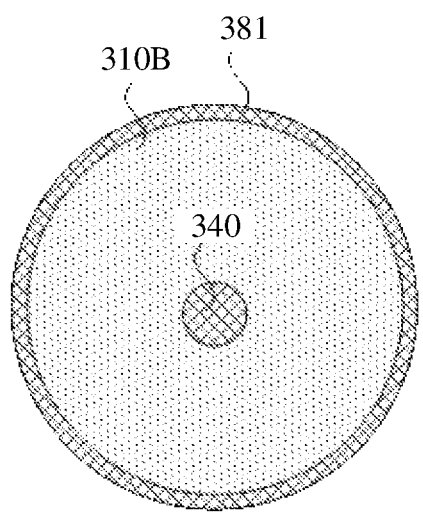
FIG. 29 is a partial top view at a line D-D in FIG. 25.

An example of the present disclosure further provides a capacitor structure prepared by the above method. Referring to FIG. 25, FIG. 26, FIG. 27, FIG. 28 and FIG. 29, FIG. 26 is a partial top view at a line A-A in FIG. 25, FIG. 27 is a partial top view at a line B-B in FIG. 25, FIG. 28 is a partial top view at a line C-C in FIG. 25, and FIG. 29 is a partial top view at a line D-D in FIG. 25. The capacitor structure includes a columnar bottom electrode 360, an annular top electrode 380, and a dielectric layer 370. The capacitor structure is disposed on a substrate 300. The substrate 300 includes a conductive contact region 301 and an insulating region 302 which are spaced. A lower surface of the columnar bottom electrode 360 is connected with the conductive contact region 301, and a lower surface of the annular top electrode 380 is connected to the insulating region 302.

The columnar bottom electrode 360 includes a conductive pillar 340 and a plurality of first gears 361. Each of the first gears 361 is connected with an outer side surface of the conductive pillar 340 and is perpendicular to a side surface of the conductive pillar 340. The plurality of first gears 361 is sequentially arranged along an axial direction (a direction Y as shown in FIG. 25) of the conductive pillar 340. In the example of the present disclosure, the columnar bottom electrode includes at least two first gears. Each of an upper end face and a lower end face of the columnar bottom electrode 360 is formed by both the end face of the conductive pillar 340 and the surface of the first gear 361.

In the example of the present disclosure, the first gear 361 surrounds the conductive pillar 340. The plurality of first gears 361 are equidistantly disposed. The first gear 361 is symmetrically disposed with the axial direction of the conductive pillar 340 as an axis of symmetry.

The annular top electrode 380 includes an annular main body 381 and the plurality of second gears 382. The second gear 382 penetrates through the annular main body 381 in a direction perpendicular to the axial direction of the annular main body 381 (the direction X as shown in FIG. 25). That is, in the direction perpendicular to the axial direction of the annular main body 381 (the direction X as shown in FIG. 25), the second gear 382 is disposed on both an inner side surface and an outer side surface of the annular main body 381. In the example of the present disclosure, the annular top electrode 380 includes at least one second gear 382. The second gear 382 surrounds the outer side surface and inner side surface of the annular main body 381. The second gear 382 is symmetrically disposed with the axial direction (the direction Y as shown in FIG. 25) of the annular main body 381 as the axis of symmetry.

In the example of the present disclosure, the plurality of second gears 382 are arranged sequentially, preferably equidistantly, along the axial direction of the annular main body 381. In some examples, each of the upper end face and lower end face of the annular top electrode 380 is formed by the end face of the annular main body 381, that is, the second gear 382 is not in contact with the insulating region 302.

The annular main body 381 is disposed around the columnar bottom electrode 360. The dielectric layer 370 is disposed between the columnar bottom electrode 360 and the annular top electrode 380 to form the capacitor structure.

The first gear 361 and the second gear 382 are alternatively arranged. The annular main body 381, the second gear 382 on the inner side surface of the annular main body 381, the bottom electrode 360 surrounded by the annular main body 381, and the dielectric layer 370 therebetween form a capacitor.

In some examples, the first gear 361 and the second gear 382 are partially overlapped in the axial direction of the conductive pillar 340 (the direction Y as shown in FIG. 25) to increase the area of the capacitor structure, thereby increasing the capacitance of the capacitor structure. In some examples, the axial direction of the conductive pillar 340 coincides with the axial direction of the annular main body 381.

In some examples, the dielectric layer 370 is formed by the jointing of the main dielectric layer 310B, the first supplementary dielectric layer 330, and the second supplementary dielectric layer 331. In the example of the present disclosure, the materials of the main dielectric layer 310B, the first supplementary dielectric layer 330, and the second supplementary dielectric layer 331 are the same. In other implementation modes of the example of the present disclosure, the materials of the main dielectric layer 310B, the first supplementary dielectric layer 330, and the second supplementary dielectric layer 331 may be different.

In the example of the present disclosure, the capacitor structure further includes a conductive connection layer 383 disposed on the upper surface of the capacitor structure. The conductive connection layer 383 is connected with the upper surface of the annular top electrode 380, and the dielectric layer 370 is disposed between the conductive connection layer 383 and the upper surface of the columnar bottom electrode 360. A top plate 390 is disposed on the conductive connection layer 383, and the top plate 390 can be electrically connected with the outside to realize an electrical connection of the top electrode 380 and the outside.

According to the capacitor structure provided by the example of the present disclosure, the first gear 361 is formed on the bottom electrode 360, the second gear 382 is formed on the top electrode 380. The first gear 361 and the second gear 382 are alternatively arranged, so that the cross area of the capacitor structure is increased, the capacitance of the capacitor structure is greatly increased, and the storage capacity of a memory is improved.

The above descriptions are merely preferred implementation modes of the examples of the present disclosure. It is noted that those of ordinary skill in the art may further make multiple changes and modifications without departing from a principle of the examples of the present disclosure. These changes and modifications should also be considered as the protection scope of the examples of the present disclosure.

The invention claimed is:

1. A method of preparing a capacitor structure, comprising:
providing a substrate, the substrate comprising a conductive contact region and an insulating region which are spaced apart;
forming a stacked layer on the substrate, the stacked layer comprising a plurality of units which are superposed and a main dielectric layer located between adjacent two units of the plurality of units, and each of the plurality of units comprising a conductive layer, the main dielectric layer, and a sacrificial layer;
forming a plurality of first via holes penetrating through the stacked layer, the plurality of first via holes corresponding to the conductive contact region and exposing a part of an upper surface of the conductive contact region;
removing a part of the sacrificial layer of a sidewall of the plurality of first via holes to form a first groove in a corresponding region of the sacrificial layer of the sidewall of the plurality of first via holes;
forming a first supplementary dielectric layer in the first groove;
filling the plurality of first via holes with a conductive material to form a conductive pillar, the conductive pillar being connected with the conductive layer, and the conductive pillar being connected with the conductive contact region;
forming a plurality of second via holes penetrating through the stacked layer at a preset radius with the conductive pillar as an axis, the plurality of second via hole surrounding the conductive pillar circumferentially, the plurality of second via holes corresponding to the insulating region and exposing a part of an upper surface of the insulating region, and the conductive pillar and the conductive layer connected with the conductive pillar together forming a columnar bottom electrode with a first gear;
removing a part of the conductive layer of a sidewall of the plurality of second via holes to form a second groove in a corresponding region of the conductive layer of the sidewall of the plurality of second via holes;
forming a second supplementary dielectric layer in the second groove, the main dielectric layer, the first supplementary dielectric layer, and the second supplementary dielectric layer covering the columnar bottom electrode;
removing all the sacrificial layer of the sidewall of the plurality of second via holes; and
filling the plurality of second via holes with the conductive material to form an annular top electrode with a second gear.

2. The method of preparing a capacitor structure of claim 1, wherein a topmost layer of the stacked layer is the sacrificial layer, when the part of the sacrificial layer of the sidewall of the plurality of first via holes is removed, the sacrificial layer as the topmost layer is removed to expose the main dielectric layer below the sacrificial layer.

3. The method of preparing a capacitor structure of claim 1, wherein the forming a first supplementary dielectric layer in the first groove comprises:
filling the plurality of first via holes with a dielectric material; and
forming a through hole penetrating through the dielectric material, the through hole being coaxial with the plurality of first via holes, a diameter of the through hole being greater than or equal to a diameter of the plurality of first via holes, and the dielectric material which is remaining forming the first supplementary dielectric layer.

4. The method of preparing a capacitor structure of claim 2, wherein the filling the plurality of first via holes with a conductive material to form a conductive pillar comprises:
filling the plurality of first via holes with the conductive material, the conductive material filling up the plurality of first via holes and covering an upper surface of the main dielectric layer; and
removing a part of the conductive material to expose the upper surface of the main dielectric layer to form the conductive pillar, an upper surface of the conductive pillar being flush with the conductive layer below the main dielectric layer.

5. The method of preparing a capacitor structure of claim 4, after forming the conductive pillar, further comprising:
depositing a dielectric material, the dielectric material being filled at least above the conductive pillar.

6. The method of preparing a capacitor structure of claim 5, wherein the dielectric material also covers the main dielectric layer, after the dielectric material is deposited, the dielectric material being planarized.

7. The method of preparing a capacitor structure of claim 1, wherein the forming a second supplementary dielectric layer in the second groove comprises:
filling the plurality of second via holes with a dielectric material; and
forming an annular through hole penetrating through the dielectric material, the annular through hole being coaxial with the plurality of second via holes, a width of the annular through hole being greater than or equal to a width of the plurality of second via holes, and the dielectric material which is remaining forming the second supplementary dielectric layer.

8. The method of preparing a capacitor structure of claim 1, wherein when filling the plurality of second via holes with the conductive material to form the annular top electrode with the second gear, the conductive material covers an upper surface of the stacked layer to form a conductive connection layer.

9. The method of preparing a capacitor structure of claim 8, wherein after filling the plurality of second via holes with the conductive material to form the annular top electrode with the second gear, the method further comprises:
forming a top plate on an upper surface of the conductive connection layer.

10. A capacitor structure, disposed on a substrate, and comprising:
a columnar bottom electrode, comprising a conductive pillar and a plurality of first gears, each of the plurality of first gears being connected with an outer side surface of the conductive pillar and being perpendicular to a side surface of the conductive pillar, and the plurality of first gears being sequentially arranged along an axial direction of the conductive pillar;
an annular top electrode, comprising an annular main body and a plurality of second gears, each of the plurality of second gears penetrating through the annular main body along a direction perpendicular to an axial direction of the annular main body, the plurality of second gears being sequentially arranged along the axial direction of the annular main body, the annular main body surrounding the columnar bottom electrode, and the plurality of first gears and the plurality of second gears being alternatively arranged; and
a dielectric layer, disposed between the columnar bottom electrode and the annular top electrode.

11. The capacitor structure of claim 10, wherein the plurality of first gears and the plurality of second gears are partially overlapped along the axial direction of the conductive pillar.

12. The capacitor structure of claim 10, wherein each of the plurality of first gears surrounds the side surface of the conductive pillar circumferentially.

13. The capacitor structure of claim 10, wherein each of the plurality of second gears surrounds a side surface of the annular main body circumferentially.

14. The capacitor structure of claim 10, wherein the substrate comprises a conductive contact region and an insulating region which are spaced apart, a lower surface of the columnar bottom electrode being connected with the conductive contact region, and a lower surface of the annular top electrode being connected with the insulating region.

15. The capacitor structure of claim 10, wherein the capacitor structure further comprises a conductive connection layer disposed on an upper surface of the capacitor structure, the conductive connection layer being connected with an upper surface of the annular top electrode, and the dielectric layer being disposed between the conductive connection layer and an upper surface of the columnar bottom electrode.

16. The capacitor structure of claim 15, wherein the capacitor structure further comprises a top plate, the top plate being disposed on the conductive connection layer.

17. The capacitor structure of claim 10, wherein an end face of the columnar bottom electrode is formed by both an end face of the conductive pillar and a surface of the plurality of first gears.

18. The capacitor structure of claim 10, wherein an end face of the annular top electrode is formed by an end face of the annular main body.

19. The capacitor structure of claim 10, wherein each of the plurality of first gears is symmetrically disposed with the axial direction of the conductive pillar as an axis of symmetry, and each of the plurality of second gears is symmetrically disposed with the axial direction of the annular main body as an axis of symmetry.

20. The capacitor structure of claim 10, wherein the axial direction of the conductive pillar coincides with the axial direction of the annular main body.

* * * * *